(12) United States Patent
Price

(10) Patent No.: US 10,447,292 B1
(45) Date of Patent: Oct. 15, 2019

(54) MULTIPLE-BIT PARALLEL SUCCESSIVE APPROXIMATION REGISTER (SAR) ANALOG-TO-DIGITAL CONVERTER (ADC) CIRCUITS

(71) Applicant: QUALCOMM Incorporated, San Diego, CA (US)

(72) Inventor: Burt Lee Price, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/113,720

(22) Filed: Aug. 27, 2018

(51) Int. Cl.
*H03M 1/12* (2006.01)
*H03M 1/14* (2006.01)
*H03M 7/16* (2006.01)

(52) U.S. Cl.
CPC ............. *H03M 1/14* (2013.01); *H03M 7/165* (2013.01)

(58) Field of Classification Search
CPC .......... H03M 1/14; H03M 7/165; H03M 1/12; H03M 1/66; H03M 1/747; H03M 1/00
USPC .................................................. 341/155, 156
See application file for complete search history.

(56) References Cited

U.S. PATENT DOCUMENTS

| | | | |
|---|---|---|---|
| 4,965,579 A | 10/1990 | Liu et al. |
| 4,994,806 A | 2/1991 | Yun-Tae |
| 5,068,662 A | 11/1991 | Guddanti et al. |
| 5,387,914 A | 2/1995 | Mangelsdorf |
| 5,420,587 A | 5/1995 | Michel |
| 5,455,583 A | 10/1995 | Stryjewski |
| 5,691,722 A | 11/1997 | Wang |
| 6,927,712 B2 | 8/2005 | Wei |
| 7,265,704 B1 | 9/2007 | Shakya |
| 7,573,922 B2 | 8/2009 | Kamatani et al. |
| 8,884,799 B2 | 11/2014 | Price et al. |
| 8,902,093 B1 | 12/2014 | Leuciuc et al. |
| 8,907,832 B2 | 12/2014 | Price et al. |
| 9,124,296 B2 | 9/2015 | Dempsey |

(Continued)

OTHER PUBLICATIONS

Kolluri, Matt, "A Multi-Step Parallel 10b 1.5μs ADC," 1984 IEEE International Solid-State Circuits Conference (ISSCC 84), Digest of Technical Papers, vol. 27, Feb. 22, 1984, pp. 60-61 and 316-317.

(Continued)

*Primary Examiner* — Jean B Jeanglaude
(74) *Attorney, Agent, or Firm* — W&T/Qualcomm

(57) ABSTRACT

Multiple-bit parallel successive approximation register (SAR) analog-to-digital converter (ADC) circuits are disclosed. In one aspect, a multiple-bit parallel SAR ADC circuit includes a number of SAR controller circuits, each of which includes SAR register circuits. Each SAR register circuit receives and stores a corresponding digital bit that is based on a comparison of an analog input signal and a corresponding digital-to-analog converter (DAC) analog signal. Each SAR register circuit also provides a corresponding digital signal based on the digital bit. A DAC circuit receives a reference voltage, and uses the reference voltage and a subset of digital signals generated by SAR controller circuits to generate multiple DAC analog signals. A compare circuit generates the digital bit corresponding to each SAR controller circuit, wherein a number of the digital bits are generated in parallel. Each digital bit collectively forms a digital representation of the analog input signal.

22 Claims, 13 Drawing Sheets

(56) References Cited

U.S. PATENT DOCUMENTS

| | | |
|---|---|---|
| 9,178,524 B1 | 11/2015 | Lee et al. |
| 9,236,878 B2 | 1/2016 | Bogner et al. |
| 9,425,814 B1 | 8/2016 | Verma |
| 9,432,035 B2 | 8/2016 | Vyas et al. |
| 9,450,596 B2 * | 9/2016 | Kim ................. H04N 5/378 |
| 9,536,497 B2 | 1/2017 | Zhang et al. |
| 9,660,660 B1 | 5/2017 | Beukema et al. |
| 2004/0113826 A1 | 6/2004 | Whittaker et al. |
| 2013/0169454 A1 | 7/2013 | Debnath et al. |
| 2013/0222330 A1 * | 8/2013 | Kern ................. G06F 3/045 |
| | | 345/174 |

OTHER PUBLICATIONS

Lin, Chi-Sheng et al., "A New Successive Approximation Architecture for Low-Power Low-Cost CMOS A/D converter," IEEE Journal of Solid-State Circuits, vol. 38, No. 1, Jan. 2003, pp. 54-62.

Pelgrom, Marcel J. M., "8.10.3 Time-related Conversion," Analog-to-digital Conversion, Dordrecht, New York, Springer, 2010, pp. 316.

Chande, Vinay et al., "On Neural Networks for Analog to Digital Conversion," IEEE Transactions on Neural Networks, vol. 6, No. 5, Sep. 1995, pp. 1269-1274.

\* cited by examiner

MULTIPLE-BIT PARALLEL SUCCESSIVE APPROXIMATION REGISTER (SAR) ANALOG-TO-DIGITAL CONVERTER (ADC) CIRCUITS

BACKGROUND

I. Field of the Disclosure

The technology of the disclosure relates generally to analog-to-digital converter (ADC) circuits, and particularly to successive approximation register (SAR) ADC circuits.

II. Background

Processor-based systems employ analog-to-digital conversion of signals in connection with performing various functions. One way to achieve such analog-to-digital conversion is by using a successive approximation register (SAR) analog-to-digital converter (ADC) circuit. The operation of a SAR ADC circuit involves performing successive comparisons of an analog input signal to a series of generated analog signals during a conversion process. A SAR ADC circuit uses the result of each comparison of the analog input signal to the series of generated analog signals to generate a final value of a digital signal.

For example, in a SAR ADC circuit, to convert an analog input signal to a digital output signal, each bit of the digital signal is initially set to a logic low "0" value during a first clock cycle of a clock signal during a conversion process. While still in the first cycle of the clock signal during the conversion process, the SAR ADC circuit sets a most significant bit of the digital signal to a logic high "1" value, but leaves all remaining bits of the digital signal at a logic low "0" value. The SAR ADC circuit converts the updated digital signal to a generated analog signal and compares the analog input signal to the generated analog signal. If the generated analog signal has a voltage greater than the analog input signal, the SAR ADC circuit changes the most significant bit from a logic high "1" value to a logic low "0" value. Conversely, if the generated analog signal has a voltage less than the analog input signal, the SAR ADC circuit leaves the most significant bit set to a logic high "1" value. The SAR ADC circuit successively sets each bit of the digital signal and compares the corresponding generated analog signal to the analog input signal in this manner during each corresponding cycle of the conversion process. Thus, following the final cycle of the clock signal during the conversion process, the digital signal generated by the SAR ADC circuit is a digital representation of the analog input signal.

In this regard, a conventional SAR ADC circuit has a conversion time that correlates to a number of bits of the digital output signal. However, as conventional SAR ADC circuits are designed to generate digital output signals with a greater number of bits, the number of circuit elements employed in a conventional SAR ADC circuit increases, as does the correlating conversion time. Thus, it would be advantageous to reduce or avoid an increase in the conversion time as the number of bits in the digital output signal increases.

SUMMARY OF THE DISCLOSURE

Aspects disclosed in the detailed description include multiple-bit parallel successive approximation register (SAR) analog-to-digital converter (ADC) circuits. In one aspect, a multiple-bit parallel SAR ADC circuit generates a digital output signal having an N number of digital bits, wherein the digital output signal is a digital representation of an analog input signal. As a non-limiting example, to perform such a conversion, the multiple-bit parallel SAR ADC circuit includes an M number of SAR controller circuits. For example, each SAR controller circuit could include one or more SAR register circuits. In response to a corresponding cycle of a clock signal, each SAR controller circuit provides a digital signal for a digital bit of the digital output signal. In response to a corresponding next cycle of the clock signal, each SAR register circuit receives and stores a corresponding digital bit, and provides a digital signal correlating to the digital bit. The multiple-bit parallel SAR ADC circuit also includes a digital-to-analog converter (DAC) circuit that uses a reference voltage and the digital signals from the corresponding SAR controller circuits to generate multiple DAC analog signals. Further, a compare circuit receives the DAC analog signals and the analog input signal. The compare circuit generates the digital bit corresponding to each SAR controller circuit, such that the compare circuit generates the M number of the N number of digital bits in parallel. Each digital bit generated during a conversion process collectively forms the digital output signal. In this manner, the digital output signal includes the N number of digital bits equal to the M number of SAR controller circuits multiplied by the P number of SAR register circuits in each SAR controller circuit (i.e., N=M*P). Generating the digital output signal by generating M number of the digital bits in parallel as described above provides a faster conversion time than conventional SAR ADC circuits even as the number of digital bits in the digital output signal increases.

In this regard in one aspect, a multiple-bit parallel SAR ADC circuit is provided. The multiple-bit parallel SAR ADC circuit comprises a plurality of SAR controller circuits, wherein each SAR controller circuit of the plurality of SAR controller circuits comprises a number of SAR register circuits. Each SAR register circuit is configured to receive a clock signal. In response to a corresponding cycle of the clock signal, each SAR register circuit is further configured to provide a digital signal. In response to a corresponding next cycle of the clock signal, each SAR register circuit is further configured to receive a corresponding digital bit, wherein the digital bit is based on a comparison of an analog input signal and a corresponding DAC analog signal, store the digital bit, and provide the digital signal correlating to the digital bit. The multiple-bit parallel SAR ADC circuit further comprises a DAC circuit configured to receive a reference voltage, and receive a plurality of digital signals from the plurality of SAR controller circuits, wherein each digital signal corresponds to a digital bit of a digital output signal. The DAC circuit is further configured to generate a plurality of DAC analog signals, wherein each DAC analog signal is based on the reference voltage and the plurality of digital signals. The multiple-bit parallel SAR ADC circuit further comprises a compare circuit configured to receive the plurality of DAC analog signals, receive the analog input signal, and generate the digital bit corresponding to each SAR controller circuit of the plurality of SAR controller circuits based on a comparison of each DAC analog signal to the analog input signal. Each digital bit generated collectively forms the digital output signal that is a digital representation of the analog input signal.

In another aspect, multiple-bit parallel SAR ADC circuit is provided. The multiple-bit parallel SAR ADC circuit comprises a plurality of means for successively approximating a digital value, wherein each means for successively approximating the digital value of the plurality of means for successively approximating the digital value comprises a number of means for storing the digital value. Each means for storing the digital value is configured to receive a clock signal, and receive a start signal indicating a conversion process. In response to a corresponding cycle of the clock signal, each means for storing the digital value is configured to provide a digital signal. In response to a corresponding next cycle of the clock signal, each means for storing the digital value is configured to receive a corresponding digital bit, wherein the digital bit is based on a comparison of an analog input signal and a corresponding DAC analog signal, store the digital bit, and provide a digital signal correlating to the digital bit. The multiple-bit SAR ADC circuit further comprises a means for converting a digital value into an analog value configured to receive a reference voltage, and receive a plurality of digital signals from a plurality of SAR controllers, wherein each digital signal corresponds to the digital bit of a digital output signal. The means for converting the digital value into the analog value is further configured to generate a plurality of DAC analog signals, wherein each DAC analog signal is based on the reference voltage and the plurality of digital signals. The multiple-bit parallel SAR ADC circuit further comprises a means for comparing configured to receive the plurality of DAC analog signals, receive the analog input signal, and generate the digital bit corresponding to each means for successively approximating the digital value of the plurality of means for successively approximating the digital value based on a comparison of each DAC analog signal to the analog input signal. Each digital bit generated collectively forms the digital output signal that is a digital representation of the analog input signal.

In another aspect, a method for converting an analog input signal into a digital output signal, wherein multiple digital bits of the digital output signal are generated in parallel, is provided. The method comprises receiving a clock signal. The method further comprises, in response to a corresponding cycle of the clock signal, providing a digital signal. The method further comprises, in response to a corresponding next cycle of the clock signal, receiving a corresponding digital bit, wherein the digital bit is based on a comparison of an analog input signal and a corresponding DAC analog signal. The method further comprises, in response to the corresponding next cycle of the clock signal, storing the digital bit. The method further comprises, in response to the corresponding next cycle of the clock signal, providing the digital signal correlating to the digital bit, and receiving a reference voltage. The method further comprises generating a plurality of DAC analog signals, wherein each DAC analog signal is based on the reference voltage and a plurality of digital signals. The method further comprises generating the corresponding digital bit based on a comparison of each corresponding DAC analog signal to the analog input signal, wherein each digital bit generated collectively forms the digital output signal that is a digital representation of the analog input signal.

DETAILED DESCRIPTION

Figure 1:
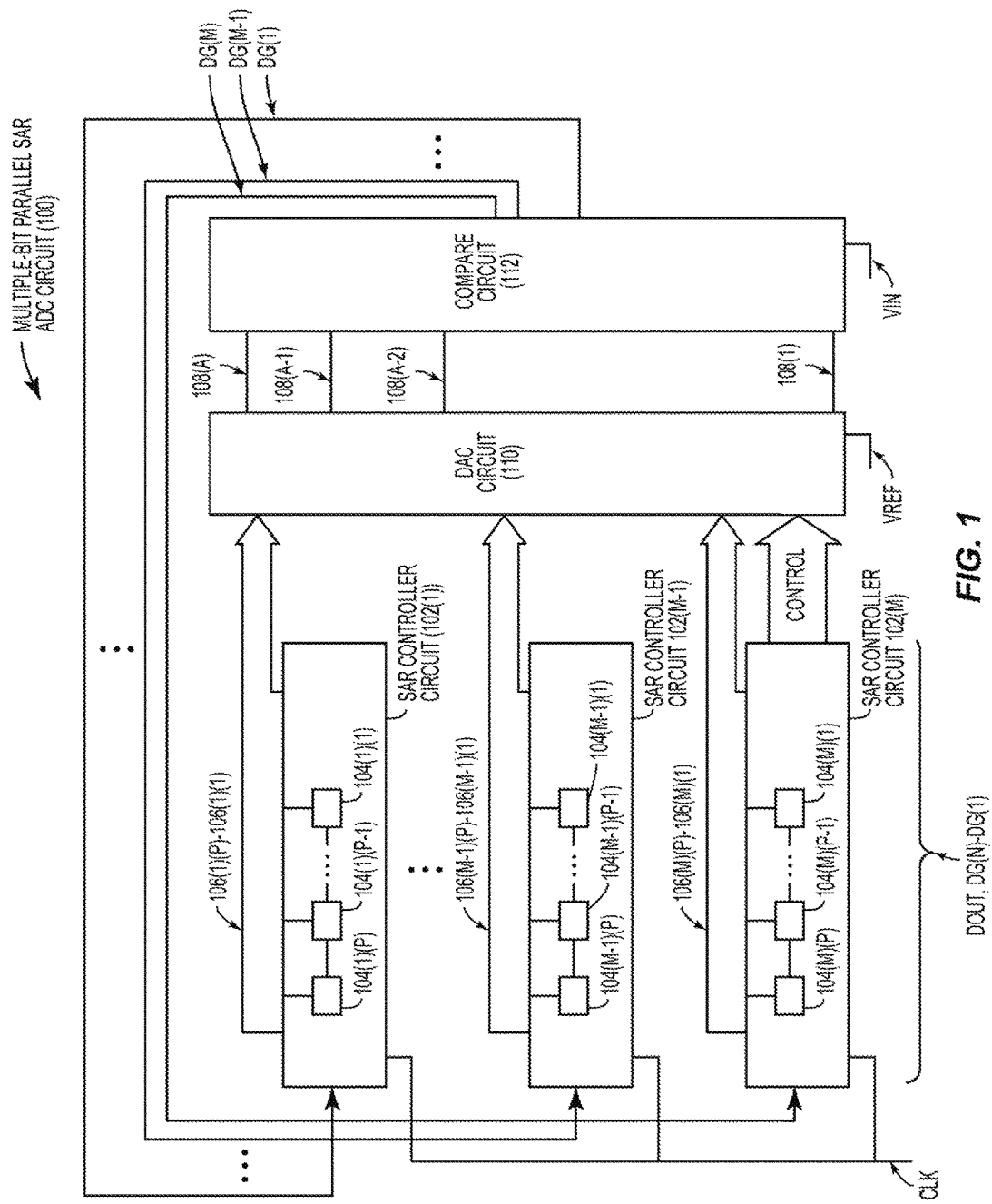
FIG. 1 is a circuit diagram of an exemplary multiple-bit parallel successive approximation register (SAR) analog-to-digital converter (ADC) circuit configured to convert an analog input signal into a digital output signal, wherein multiple bits of the digital output signal are generated in parallel.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include multiple-bit parallel successive approximation register (SAR) analog-to-digital converter (ADC) circuits. In one aspect, a multiple-bit parallel SAR ADC circuit generates a digital output signal having an N number of digital bits, wherein the digital output signal is a digital representation of an analog input signal. As a non-limiting example, to perform such a conversion, the multiple-bit parallel SAR ADC circuit includes an M number of SAR controller circuits. For example, each SAR controller circuit could include one or more SAR register circuits. In response to a corresponding cycle of a clock signal, each SAR controller circuit provides a digital signal for a digital bit of the digital output signal. In response to a corresponding next cycle of the clock signal, each SAR register circuit receives and stores a corresponding digital bit, and provides a digital signal correlating to the digital bit. The multiple-bit parallel SAR ADC circuit also includes a digital-to-analog converter (DAC) circuit that uses a reference voltage and the digital signals from the corresponding SAR controller circuits to generate multiple DAC analog signals. Further, a compare circuit receives the DAC analog signals and the analog input signal. The compare circuit generates the digital bit corresponding to each SAR controller circuit, such that the compare circuit generates the M number of the N number of digital bits in parallel. Each digital bit generated during a conversion process collectively forms the digital output signal. In this manner, the digital output signal includes the N number of digital bits equal to the M number of SAR controller circuits multiplied by the P number of SAR register circuits in each SAR controller circuit (i.e., N=M*P). Generating the digital output signal by generating M number of the digital bits in parallel as described above provides a faster conversion time than conventional SAR ADC circuits even as the number of digital bits in the digital output signal increases.

In this regard, FIG. 1 illustrates an exemplary multiple-bit parallel SAR ADC circuit 100 configured to convert an analog input signal VIN into a digital output signal DOUT, wherein an M number of digital bits DG(N)-DG(1) of the digital output signal DOUT are generated in parallel. In aspects described herein, the digital bit DG(N) (e.g., the highest numbered digital bit DG) is a most significant bit (MSB) of the digital output signal DOUT, and the digital bit DG(1) (e.g., the lowest numbered digital bit DG) is a least significant bit (LSB) of the digital output signal DOUT. To perform such a conversion, the multiple-bit parallel SAR ADC circuit 100 includes an M number of SAR controller circuits 102(1)-102(M). In this non-limiting example, each of the SAR controller circuits 102(1)-102(M) includes a P number of SAR register circuits 104(1)(1)-104(M)(P), but such is not required. A SAR register circuit can be any type of circuit that can generate a digital signal corresponding to a received digital bit. The SAR register circuits 104(1)(P)-104(1)(1) are in the SAR controller circuit 102(1). The SAR register circuits 104(M-1)(P)-104(M-1)(1) are in the SAR controller circuit 102(M-1). The SAR register circuits 104(M)(P)-104(M)(1) are in the SAR controller circuit 102(M). Each of the SAR register circuits 104(1)(1)-104(M)(P) is configured to receive a clock signal CLK. In response to a corresponding cycle of the clock signal CLK, each SAR register circuit 104(1)(1)-104(M)(P) provides a digital signal 106(1)(1)-106(M)(P). In response to a corresponding next cycle of the clock signal CLK, each SAR register circuit 104(1)(1)-104(M)(P) receives and stores a digital bit DG(1)-DG(N) corresponding to the SAR controller circuit 102(1)-102(M) based on a comparison of the analog input signal VIN and a corresponding DAC analog signal 108(1)-108(A). Each SAR register circuit 104(1)(1)-104(M)(P) also provides the digital signal 106(1)(1)-106(M)(P) correlating to the digital bit DG(1)-DG(N) in the next cycle referenced above.

With continuing reference to FIG. 1, the multiple-bit parallel SAR ADC circuit 100 includes a DAC circuit 110 that receives a reference voltage VREF, as well as the digital signals 106(1)(1)-106(M)(P). As will be discussed by example in more detail below, the DAC circuit 110 generates multiple DAC analog signals 108(1)-108(A) based on the reference voltage VREF and the digital signals 106(1)(1)-106(M)(P) and the control signals CONTROL. The SAR register circuits 104(1)(1)-104(M)(P) of the SAR controller circuits 102(1), 102(2) generate the control signals CONTROL that communicate timing information to the DAC circuit 110 for passing the designated the digital signals 106(1)(5)-106(1)(1), 106(2)(5)-106(2)(1) from the SAR controller circuits 102(1), 102(2) to the compare circuit 112. The control signals CONTROL SEL may be generated by another controller that controls timing. Additionally, a compare circuit 112 receives the DAC analog signals 108(1)-108(A) and the analog input signal VIN. Using the DAC analog signals 108(1)-108(A) and the analog input signal VIN, the compare circuit 112 generates a digital bit DG(1)-DG(M) corresponding to each SAR controller circuit 102(1)-102(M), such that the compare circuit 112 generates the M number of the N number of digital bits DG(1)-DG(N) in each cycle of the clock signal CLK (i.e., in parallel), which are stored in the corresponding SAR register circuits 104(1)(1)-104(M)(P) during the conversion process. Each digital bit DG(1)-DG(N) generated collectively forms the digital output signal DOUT that is a digital representation of the analog input signal VIN. In this manner, the digital output signal DOUT includes the N number of digital bits DG(1)-DG(N) equal to the M number of SAR controller circuits 102(1)-102(M) multiplied by the P number of bits stored in the SAR register circuits 104(1)(1)-104(M)(P) in each controller circuit 102(1)-102(M) (i.e., N=M*P). As used herein, the numbers M, N, and P are positive integer numbers. Generating the digital output signal DOUT by generating M number of the digital bits DG(1)-DG(N) in parallel as described above provides a faster conversion time than conventional SAR ADC circuits even as the number of digital bits DG(1)-DG(N) in the digital output signal DOUT increases.

Figure 2:
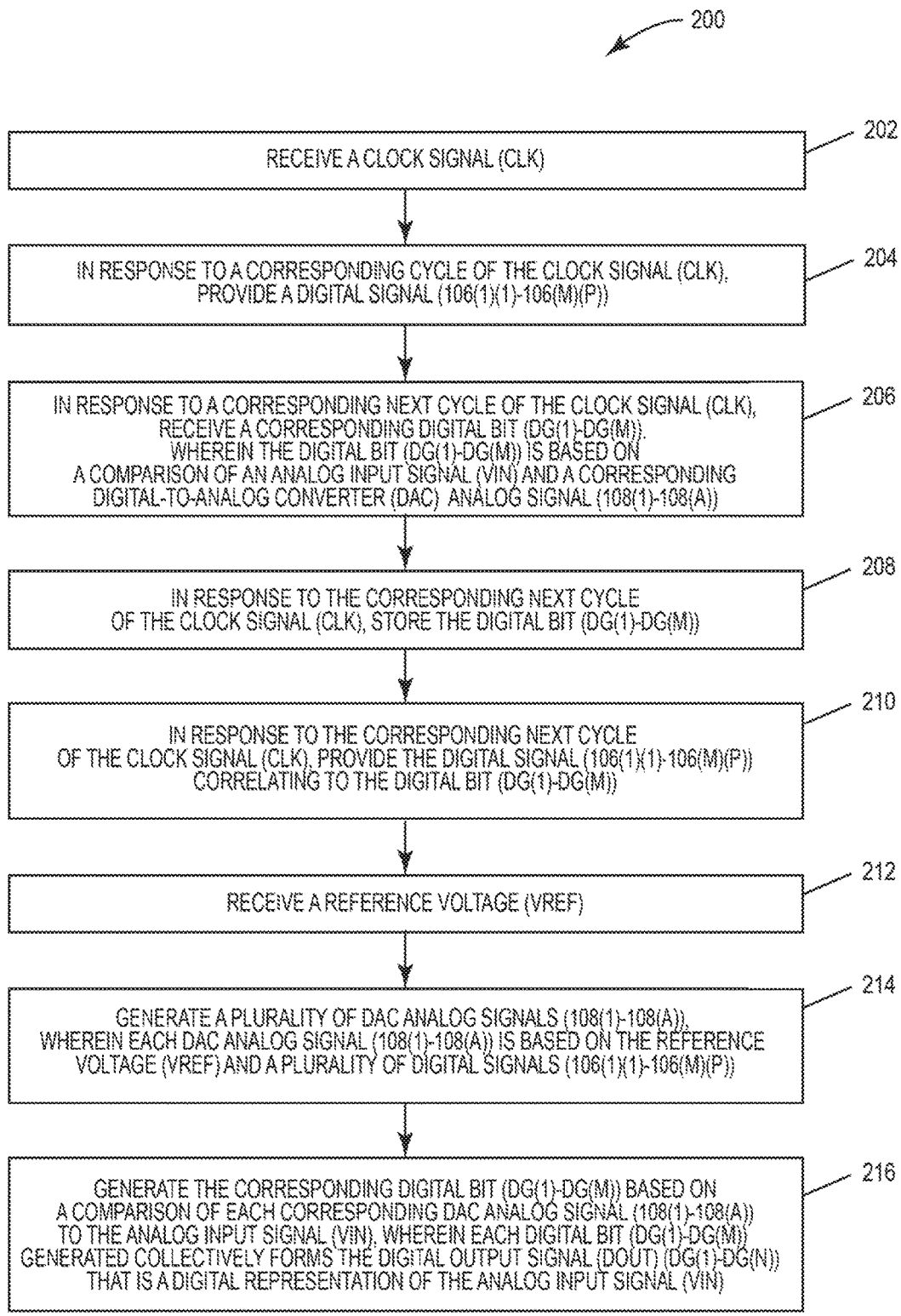
FIG. 2 is a flowchart illustrating an exemplary process that can be performed by the multiple-bit parallel SAR ADC circuit of FIG. 1 to convert an analog input signal into a digital output signal, wherein multiple digital bits of the digital output signal are generated in parallel.

FIG. 2 illustrates an exemplary process 200 that can be performed by the multiple-bit parallel SAR ADC circuit 100 of FIG. 1 to convert the analog input signal VIN into the digital output signal DOUT, wherein M multiple digital bits DG(1)-DG(M) of the N-bit width digital output signal DOUT (i.e., DG(1)-DG(N)) are generated in parallel. The process 200 includes each SAR register circuit 104(1)(1)-104(M)(P) receiving the clock signal CLK (block 202). Additionally, the process 200 includes each SAR register circuit 104(1)(1)-104(M)(P), in response to a corresponding cycle of the clock signal CLK, providing the digital signal 106(1)(1)-106(M)(P) (block 204). The process 200 also includes each SAR register circuit 104(1)(1)-104(M)(P), in response to a corresponding next cycle of the clock signal CLK, receiving the corresponding digital bit DG(1)-DG(M), wherein the digital bit DG(1)-DG(M) is based on a comparison of the analog input signal VIN and the corresponding DAC analog signal 108(1)-108(A) (where $A=2^M-1$) (block 206). The process 200 also includes each SAR register circuit 104(1)(1)-104(M)(P), in response to the corresponding next cycle of the clock signal CLK, storing the digital bit DG(1)-DG(M) (block 208). The process 200 also includes each SAR register circuit 104(1)(1)-104(M)(P), in response to the corresponding next cycle of the clock signal CLK, providing the digital signal 106(1)(1)-106(M)(P) correlating to the digital bit DG(1)-DG(M) (block 210). Further, the process 200 includes the DAC circuit 110 receiving the reference voltage VREF (block 212). Further, the process 200 includes the DAC circuit 110 generating the plurality of DAC analog signals 108(1)-108(A), wherein each DAC analog signal 108(1)-108(A) is based on the reference voltage VREF and the plurality of digital signals 106(1)(1)-106(M)(P) and the control signals CONTROL (block 214). The process 200 also includes the compare circuit 112 generating the digital bit DG(1)-DG(M) corresponding to each SAR controller circuit 102(1)-102(M) based on a comparison of each DAC analog signal 108(1)-108(A) to the analog input signal VIN (block 216). In this manner, each digital bit DG(1)-DG(M) generated collectively forms the digital output signal DOUT (DG(1)-DG(N)) that is a digital representation of the analog input signal VIN.

Details of specific aspects of the multiple-bit parallel SAR ADC circuit 100 are now described. In this regard, FIGS. 3A and 3B illustrate an exemplary two (2) bit parallel ten (10)

bit SAR ADC circuit 300 configured to convert the analog input signal VIN into the digital output signal DOUT having ten (10) digital bits DG(10)-DG(1), wherein the DAC circuit 110 employs single-output DAC circuits 302(1)-302(3). As discussed beginning in FIGS. 5A and 5B below, other aspects of the multiple-bit parallel SAR ADC circuit 100 disclosed herein can employ a multiple-output DAC circuit instead of the single-output DAC circuits 302(1)-302(3). The two (2) bit parallel ten (10) bit SAR ADC circuit 300 includes common elements with the multiple-bit parallel SAR ADC circuit 100 of FIG. 1, which are referred to with common element numbers in FIG. 1 and FIGS. 3A and 3B, and thus will not re-described herein.

Figure 3A:
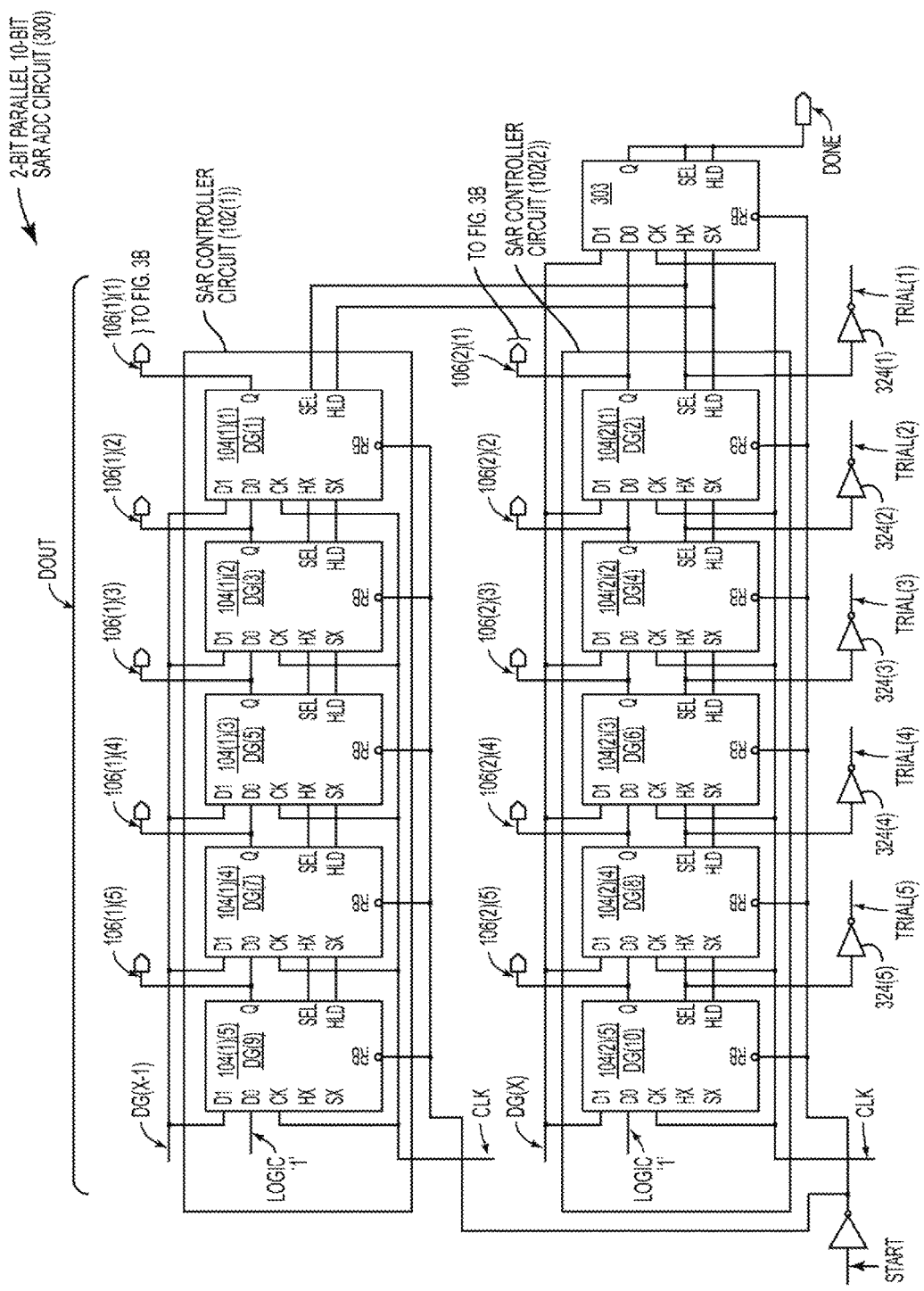
FIGS. 3A-3B illustrate a circuit diagram of an exemplary two (2) bit parallel ten (10) bit SAR ADC circuit that employs single-output digital-to-analog converter (DAC) circuits.
Figure 3B:
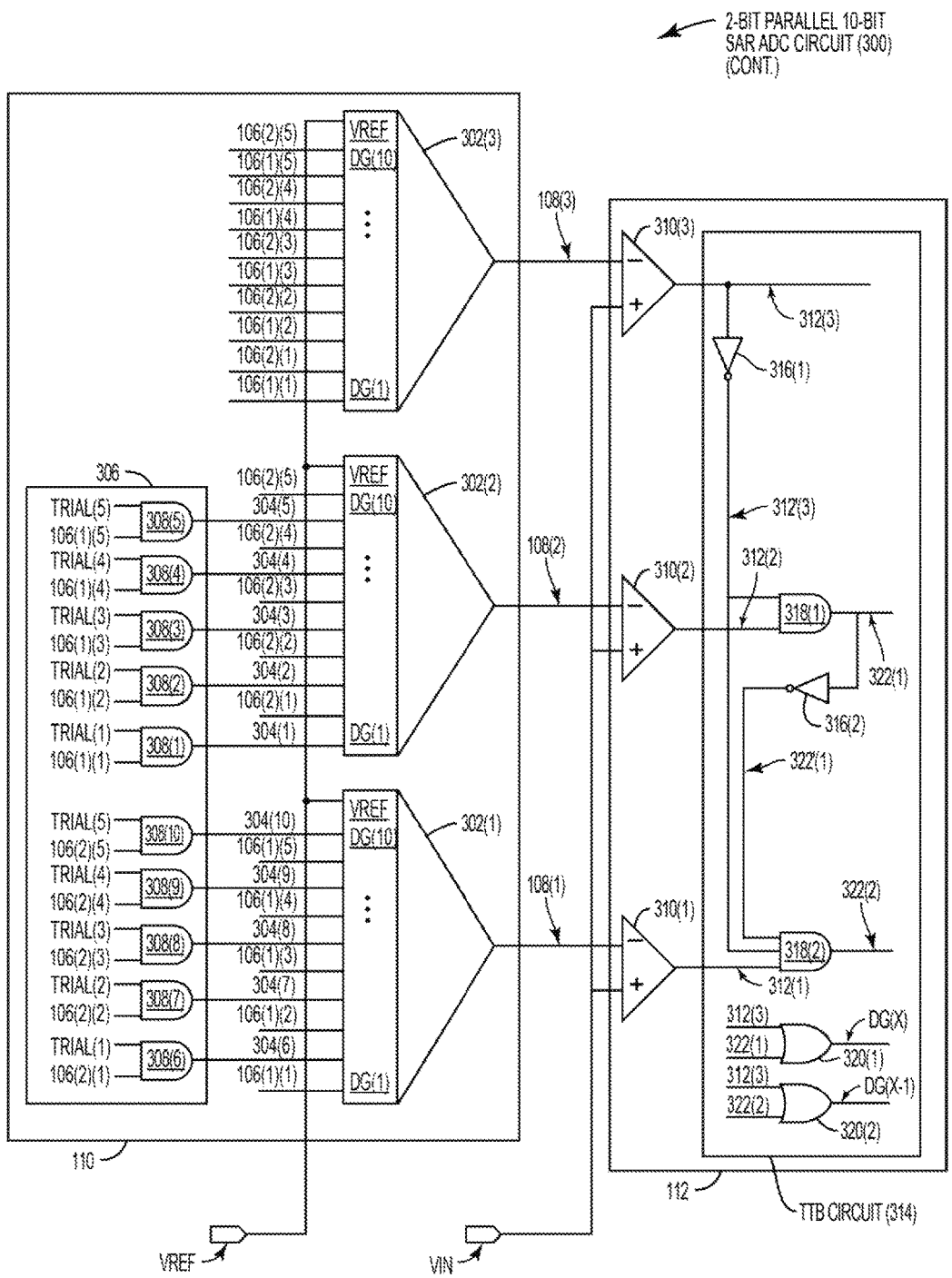

With reference to FIGS. 3A and 3B, the two (2) bit parallel ten (10) bit SAR ADC circuit 300 employs the SAR controller circuits 102(1), 102(2), thus allowing two (2) digital bits DG(1)-DG(10) of the digital output signal DOUT to be generated in parallel. Each SAR controller circuit 102(1), 102(2) employs five (5) SAR register circuits 104(1)(1)-104(2)(5) such that the conversion process may generate the ten (10) digital bits DG(1)-DG(10) of the digital output signal DOUT in five (5) cycles of the clock signal CLK. In particular, the SAR register circuits 104(1)(5)-104(1)(1) of the SAR controller circuit 102(1) are configured to receive and store the respective corresponding digital bits DG(9), DG(7), DG(5), DG(3), and DG(1). Digital bit DG(9) is generated in a first clock cycle, and then digital bit DG(7) is generated in a subsequent clock cycle, and so on until eventually, digital bit DG(1) is generated. The SAR register circuits 104(1)(5)-104(1)(1) are also configured to provide the corresponding, respective digital signals 106(1)(5)-106(1)(1) over multiple clock cycles. In particular, the digital signals 106(1)(5)-106(1)(1) are generated in different clock cycles of the clock signal CLK based on the corresponding digital bits DG(9), DG(7), DG(5), DG(3), and DG(1) generated over the respective clock cycles in of the clock signal CLK. For example, digital signal 106(1)(5) is generated for digital bit DG(9) in a first clock cycle, digital signal 106(1)(4) is generated for digital bit DG(7) in a subsequent clock cycle, and so on.

With continuing reference to FIGS. 3A and 3B, the SAR register circuits 104(2)(1)-104(2)(5) of the SAR controller circuit 102(2) are configured to receive and store the corresponding digital bits DG(2), DG(4), DG(6), DG(8), and DG(10). the SAR register circuits 104(2)(5)-104(2)(1) of the SAR controller circuit 102(2) are configured to receive and store the respective corresponding digital bits DG(10), DG(8), DG(6), DG(4), and DG(2). Digital bit DG(10) is generated in a first clock cycle, and then digital bit DG(8) is generated in a subsequent clock cycle, and so on until eventually, digital bit DG(2) is generated. The SAR register circuits 104(2)(5)-104(2)(1) are also configured to provide the corresponding, respective digital signals 106(2)(5)-106(2)(1) over multiple clock cycles. In particular, the digital signals 106(2)(5)-106(2)(1) are generated in different clock cycles of the clock signal CLK based on the corresponding digital bits DG(10), DG(8), DG(6), DG(4), and DG(2) generated over the respective clock cycles in of the clock signal CLK. For example, digital signal 106(2)(5) is generated for digital bit DG(10) in a first clock cycle, digital signal 106(2)(4) is generated for digital bit DG(8) in a subsequent clock cycle, and so on. Further, as described in greater detail below, in addition to receiving the clock signal CLK and the corresponding digital bits DG(1)-DG(10), each SAR register circuit 104(1)(1)-104(2)(5) is configured to receive a select signal SEL. The select signal SEL is a signal used by the 2-bit parallel 10-bit SAR ADC circuit 300 to generate the trial signals TRIAL(5)-TRIAL(1) communicate timing information between the SAR controller circuits 102(1), 102(2) and the DAC circuit 110 for passing the designated digital signals 106(1)(5)-106(1)(1), 106(2)(5)-106(2)(1) from the SAR controller circuits 102(1), 102(2) to the TTB circuit 314. The select signal SEL may be generated by another controller that controls timing. The START signal starts the conversion process. In this aspect, when START signal is high, each SAR register circuit 104(1)(5)-104(2)(1) is reset. When the START signal goes low, then on the next rising edge of the clock signal CLK, the conversion process starts. Further, the 2-bit parallel 10-bit SAR ADC circuit 300 also includes a SAR register circuit 303 configured to generate a done signal DONE indicating that the conversion process is complete.

With continuing reference to FIGS. 3A-3B, as noted above, the DAC circuit 110 in this aspect employs the single-output DAC circuits 302(1)-302(3). In particular, the number A of single-output DAC circuits 302(1)-302(3) (i.e., three (3)) equals two (2) raised to a number M of SAR controller circuits 102(1), 102(2) (e.g., two (2)), quantity minus one (1) (i.e., $A=(2^M)-1=(2^2)-1=3$). Each single-output DAC circuit 302(1)-302(3) is configured to generate a corresponding DAC analog signal 108(1)-108(3) based on the reference voltage VREF, the digital bits DG(1)-DG(10), and a corresponding trial bit code 304(1)-304(10). More specifically, each trial bit code 304(1)-304(10) includes a digital bit sequence with values for a subset of the digital bits DG(1)-DG(10) corresponding to the digital output signal DOUT.

With continuing reference to FIGS. 3A-3B, to generate the trial bit codes 304(1)-304(10), the DAC circuit 110 includes a trial bit circuit 306 that is configured to receive the digital signals 106(1)(1)-106(2)(5) from each corresponding SAR register circuit 104(1)(1)-104(2)(5) and trial signals TRIAL(1)-TRIAL(5), and generate the trial bit codes 304(1)-304(10) based on such values. For example, in this aspect, the trial bit circuit 306 includes AND-based gates 308(1)-308(10) (e.g., AND gates 308(1)-308(10)). The AND gates 308(1)-308(5) are configured to receive the digital signals 106(1)(1)-106(1)(5), respectively, as well as the trial signals TRIAL(1)-TRIAL(5), respectively, and generate the corresponding trial bit codes 304(1)-304(5). Additionally, the AND gates 308(6)-308(10) are configured to receive the digital signals 106(2)(1)-106(2)(5), respectively, as well as trial signals TRIAL(1)-TRIAL(5), respectively, and generate the corresponding trial bit codes 304(6)-304(10).

With continuing reference to FIGS. 3A-3B, the single-output DAC circuit 302(3) receives the digital signals 106(1)(1)-106(2)(5) and the reference voltage VREF, and generates the DAC analog signal 108(3) based on such values. Further, the single-output DAC circuit 302(2) receives the digital signals 106(1)(1)-106(1)(5), and the trial bit codes 304(1)-304(5), and generates the DAC analog signal 108(2) based on such values. Additionally, the single-output DAC circuit 302(1) receives the digital signals 106(2)(1)-106(2)(5), and the trial bit codes 304(6)-304(10), and generates the DAC analog signal 108(1) based on such values.

With continuing reference to FIGS. 3A and 3B, the compare circuit 112 in this aspect includes compare circuits 310(1)-310(3). In particular, the number B of compare circuits 310(1)-310(3) (i.e., three (3)) equals two (2) raised to a number A of SAR controller circuits 102(1), 102(2) (e.g., two (2)), quantity minus one (1) (i.e., $B=(2^A)-1=(2^2)-1=3$). Each compare circuit 310(1)-310(3) is configured to receive the analog input signal VIN and the corresponding DAC analog signal 108(1)-108(3), and generate a corresponding 312(1)-312(3). More specifically, each corresponding comparator signal 312(1)-312(3) has a logic comparator signal high "1" value if the analog input signal VIN has a greater value voltage than the corresponding DAC analog signal 108(1)-108(3). Alternatively, each corresponding comparator signal 312(1)-312(3) has a logic low "0" value if the analog input signal VIN has a smaller voltage than the corresponding DAC analog signal 108(1)-108(3).

With continuing reference to FIGS. 3A and 3B, the compare circuit 112 in this aspect also includes a thermometer-to-binary (TTB) circuit 314 (FIG. 3B) configured to receive the comparator signals 312(1)-312(3) from each compare circuit 310(1)-310(3), and generate a two digital bits of DOUT (DG(1)-DG(N)), shown as digital bit DG(X-1)-DG(X) corresponding to each SAR controller circuit 102(1), 102(2). For example, in a first clock cycle of the clock signal CLK, the TTB circuit 314 generates DG(9) and DG(8) in digital signals 106(1)(5), 106(2)(5). For example, in this aspect, the TTB circuit 314 employs inverters 316(1), 316(2), AND-based gates 318(1), 318(2) (e.g., AND gates 318(1), 318(2)), and OR-based gates 320(1), 320(2) (e.g., OR gates 320(1), 320(2)). The comparator signal 312(3) is provided to the inverter 316(1) such that the inverter 316(1) generates an inverse comparator signal 312'(3), which is provided to the AND gates 318(1), 318(2). Additionally, the comparator signal 312(2) is provided to the AND gate 318(1). In this example, the AND gate 318(1) generates an intermediary comparator signal 322(1) that has a logic high "1" value if the comparator signal 312(1) has a logic low "0" value while the comparator signal 312(2) has a logic high "1" value. The intermediary comparator signal 322(1) is provided to the inverter 316(2), wherein the inverter 316(2) generates an inverse intermediary comparator signal 322'(1) that is provided to the AND gate 318(2). The inverse intermediary comparator signal 322'(1) is also provided to the AND gate 318(2), wherein the AND gate 318(2) generates an intermediary comparator signal 322(2) that has a logic high "1" value if the comparator signals 312(1), 312(2) each have a logic low "0" value while the comparator signal 312(3) has a logic high "1" value, and a logic low "0" value otherwise. Thus, the possibilities of the DAC analog signals 108(1)-108(3) are "000", "001", "011", or "111" because of how the DAC analog signals 108(1)-108(3) generated by the comparator circuits 302(1)-302(3) generate a thermometer code based on which of the threshold values in the digital signals 106(1)(5)-106(2)(1), the input VIN is greater than. In this regard, the TTB circuit 314 generates "00" for digital bits DG(X), DG(X-1) for DAC analog signals 108(1)-108(3) of "000" for digital signals 108(1)-108(3), it generates "01" for digital bits DG(X), DG(X-1) for DAC analog signals 108(1)-108(3); it generates "10" for digital bits DG(X), DG(X-1) for DAC analog signals 108(1)-108(3); and it generates "11" for digital bits DG(X), DG(X-1) for DAC analog signals 108(1)-108(3) of "111". The comparator signal 312(3) and the intermediary comparator signal 322(1) are provided to the OR gate 320(1), wherein the OR gate 320(1) generates the digital bit DG(X). Additionally, the comparator signal 312(3) and the intermediary comparator signal 322(2) are provided to the OR gate 320(2), wherein the OR gate 320(2) generates the digital bit DG(X-1). As discussed in more detail below, other aspects may employ the compare circuit 112 that include successive approximately (SA) Flash-based comparators, wherein such aspects do not include the TTB circuit 314.

With continuing reference to FIGS. 3A and 3B, a non-limiting example is now described. In this manner, the analog input signal VIN is approximately equal to 1.66478 Volts (V), and the reference voltage VREF is equal to five (5) V. In a first cycle of the clock signal CLK, signals of logic high '1' value (which may be sourced from the supply voltage VDD for example) are provided by the SAR register circuits 104(1)(5), 104(2)(5) corresponding to the digital bits DG(9), DG(10), respectively, while the SAR register circuits 104(1)(1)-104(1)(4) and 104(2)(1)-104(2)(4) corresponding to the digital bits DG(1)-DG(8) all provide a logic low "0" value. As a result, inputs of the single-output DAC circuit 302(3) corresponding to the digital bits DG(10), DG(9) are signals, of logic high "1" value, while inputs corresponding to the digital bits DG(8)-DG(1) receive a logic low "0" value. Also in the first cycle of the clock signal CLK, the trial bits TRIAL(5)-TRIAL(1) are provided by inverters 324(5)-324(1) such that the trial bit TRIAL(5) has a logic low "0" value, while the trial bits TRIAL(4)-TRIAL(1) have a logic high "1" value. As a result, inputs of the single-output DAC circuit 302(2) receive signals indicating a digital value of "1000000000." The inputs of the single-output DAC circuit 302(3) receive signals indicating a digital value of "0100000000." The inputs of the single-output DAC 302(1) receive signals indicating a digital value of "1100000000." As an example, inputs to the single-output DAC circuits 302(1)-302(3) produce DAC outputs of 3.75V, 2.5V, and 1.25V, respectively as the DAC analog signals 108(1)-108(3).

With continuing reference to FIGS. 3A and 3B, the single-output DAC circuits 302(1)-302(3) generate the corresponding DAC analog signals 108(1)-108(3), and the compare circuit 112 generates the digital bit DG(10) having a logic low "0" value, and the digital bit DG(9) having a logic high "1" value. In response to a next cycle (e.g., a second cycle) of the clock signal CLK, the digital bits DG(9), DG(10) are received and stored by the SAR register circuits 104(1)(5), 104(2)(5), which now provide the stored values for the digital signals 106(1)(5) and 106(2)(5)). Also in response to the second cycle of the clock signal CLK, signals of a logic '1' high value are provided by the SAR register circuits 104(1)(4), 104(2)(4) corresponding to the digital bits DG(7), DG(8) (see FIG. 3A), respectively, while the SAR register circuits 104(1)(5), 104(1)(3)-104(1)(1), and 104(2)(5), 104(2)(3)-104(2)(1), corresponding to the digital bits DG(10), DG(9) and DG(6)-DG(1) all provide a logic low "0" value. The trial bits TRIAL(1)-TRIAL(5) and the DAC analog signals 108(1)-108(3) change accordingly such that the compare circuit 112 generates the digital bit DG(8) having a logic low "0" value, and the digital bit DG(7) having a logic high "1" value. In response to the next cycle (e.g., a third cycle) of the clock signal CLK, the SAR register circuits 104(2)(4), 104(1)(4) store the digital bits DG(8), DG(7), and the conversion process continues for the remaining digital bits DG(6)-DG(1). At the conclusion of a fifth cycle of the clock signal CLK, the two (2)-bit parallel ten (10)-bit SAR ADC circuit 300 has generated and stored the digital output signal DOUT having the digital bits DG(10)-DG(1) having the values "0101010100." In this regard, the two (2)-bit parallel ten-(10)-bit SAR ADC circuit 300 generates the digital output signal DOUT in five (5) cycles of the clock signal CLK with two digital bits DG(X), DG(X-1) of the digital bits DG(10)-DG(1) of the digital output signal DOUT generated per clock cycle of the clock signal CLK, rather than in ten (10) cycles as needed by conventional single-bit SAR ADC circuits.

Figure 4:
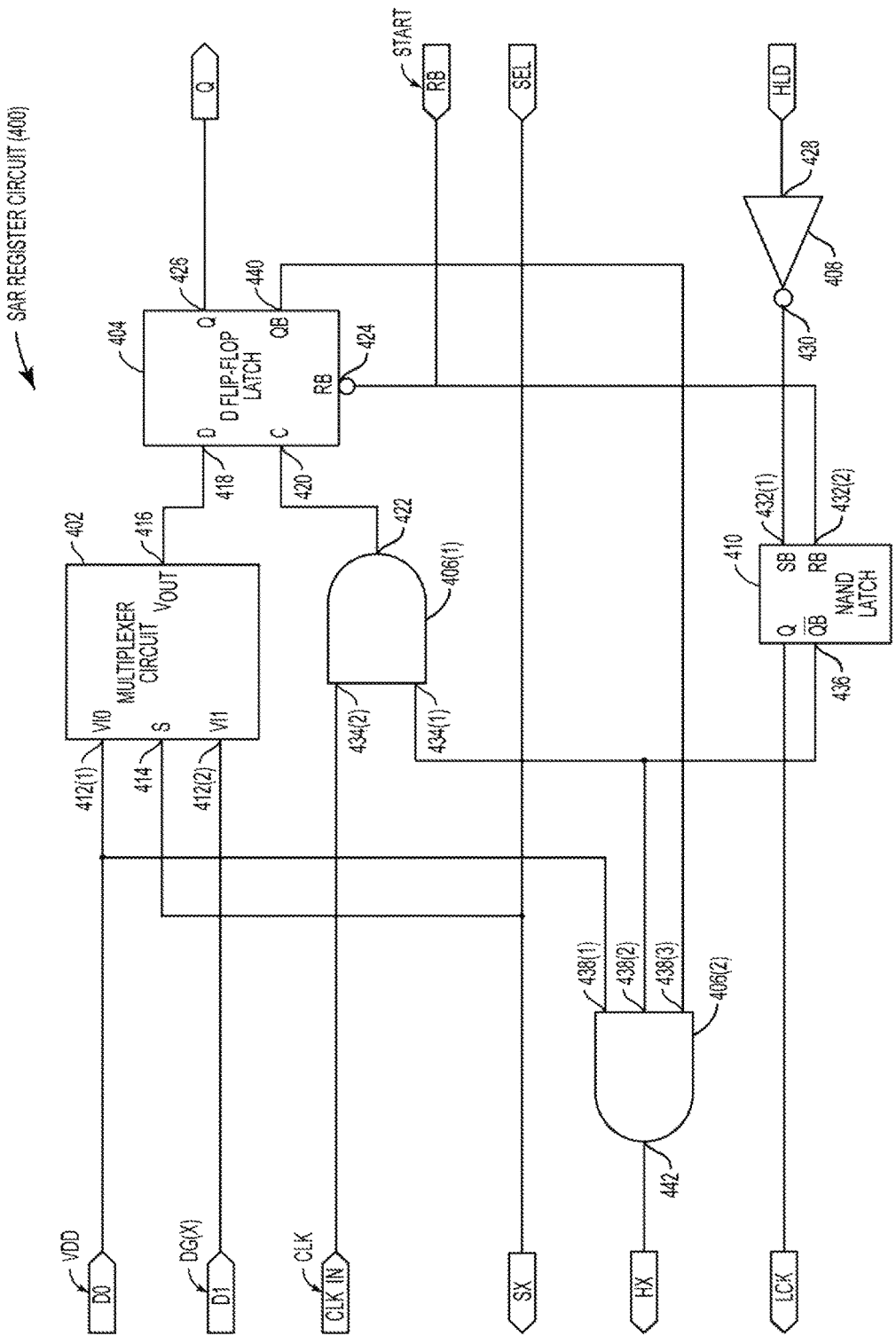
FIG. 4 is a circuit diagram of an exemplary SAR register circuit employed in the multiple-bit parallel SAR ADC circuit of FIGS. 3A and 3B.

FIG. 4 illustrates an exemplary SAR register circuit 400 that can be employed in the 2-bit parallel 10-bit SAR ADC circuit 300 of FIGS. 3A-3B for each of the SAR register circuits 104(1)(1)-104(2)(5) to achieve the functionality of the example described above with reference to FIGS. 3A-3B. In this aspect, the SAR register circuit 400 includes a multiplexer circuit 402, a D flip-flop latch 404, AND gates 406(1), 406(2), an inverter 408, and a NAND latch 410. The SAR register circuit 400 also includes an input node D0 configured to receive a voltage of a logic '1' high value and an input node D1 configured to receive the corresponding digital bit DG(X). Further, the SAR register circuit 400 includes a start input node RB configured to receive the start signal START, a select input node SEL, a select output node SX, a hold input node HLD, a hold output node HX, a clock input node CLK_IN, and an output node Q.

With continuing reference to FIG. 4, the multiplexer circuit 402 includes input nodes 412(1), 412(2) that are electrically coupled to the input nodes D0, D1, respectively. The multiplexer circuit 402 also includes a select input 414 electrically coupled to the select input node SEL of the SAR register circuit 400. An output node 416 is electrically coupled to an input node 418 of the D flip-flop latch 404. Further, the D flip-flop latch 404 includes a clock input node 420 electrically coupled to an output node 422 of the AND gate 406(1), a ready input node 424 electrically coupled to the start input node RB, and an output node 426 electrically coupled to the output node Q. An input node 428 of the inverter 408 is electrically coupled to the hold input node HLD, while an output node 430 of the inverter 408 is electrically coupled to an input node 432(1) of the NAND latch 410. An input node 432(2) of the NAND latch 410 is electrically coupled to the start input node RB. An input node 434(1) of the AND gate 406(1) is electrically coupled to an inverse output node 436 of the NAND latch 410, while an input node 434(2) of the AND gate 406(1) is electrically coupled to the clock input node CLK_IN. Input nodes 438(1)-438(3) of the AND gate 406(2) are electrically coupled to the input node D0, the inverse output node 436, and an inverse output node 440 of the D flip-flop latch 404, while an output node 442 of the AND gate 406(2) is electrically coupled to the hold output node HX.

Figure 5A:
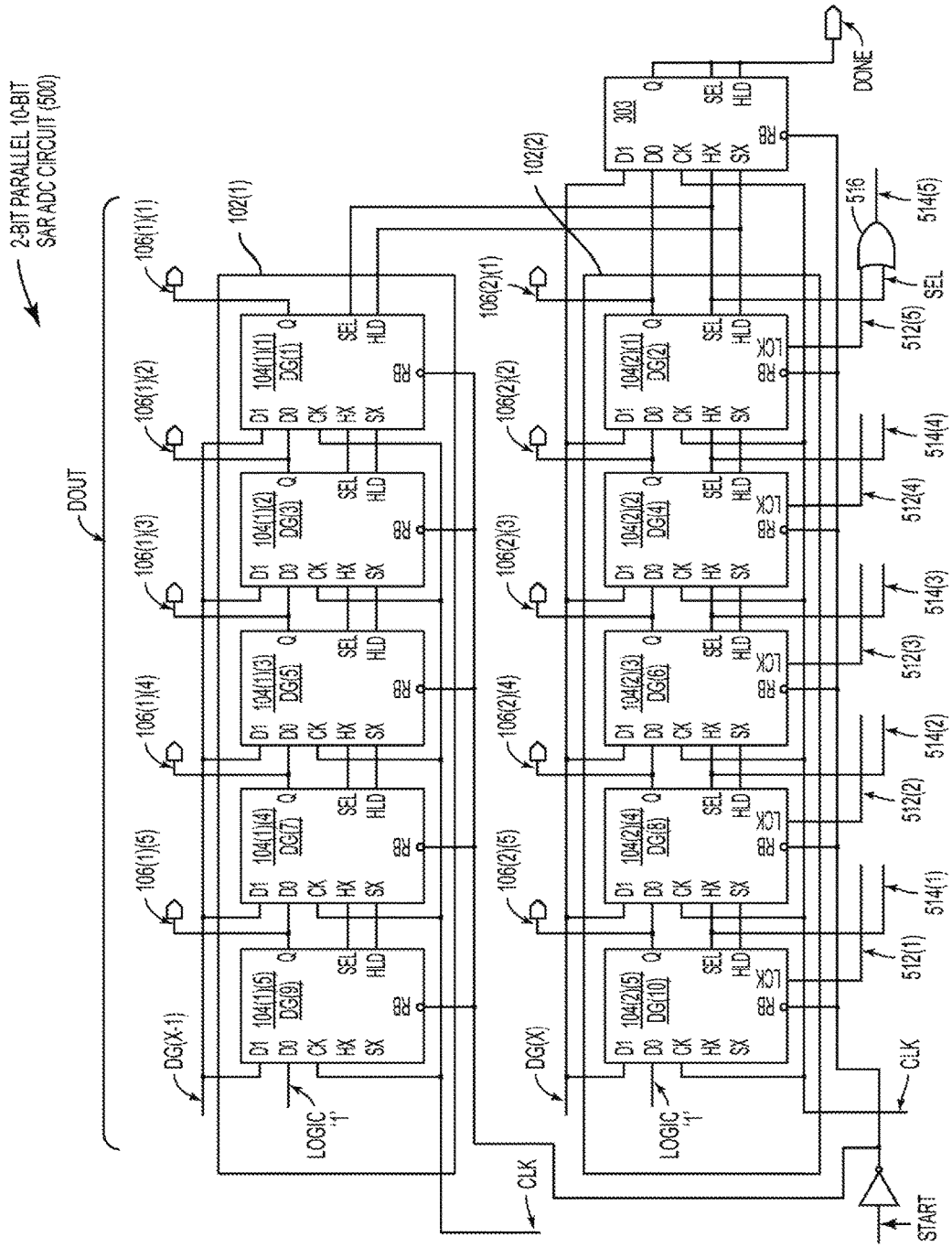
FIGS. 5A and 5B illustrate a circuit diagram of an exemplary multiple-bit parallel SAR ADC circuit that employs a multiple-output DAC circuit instead of single-output DAC circuits.
Figure 5B:
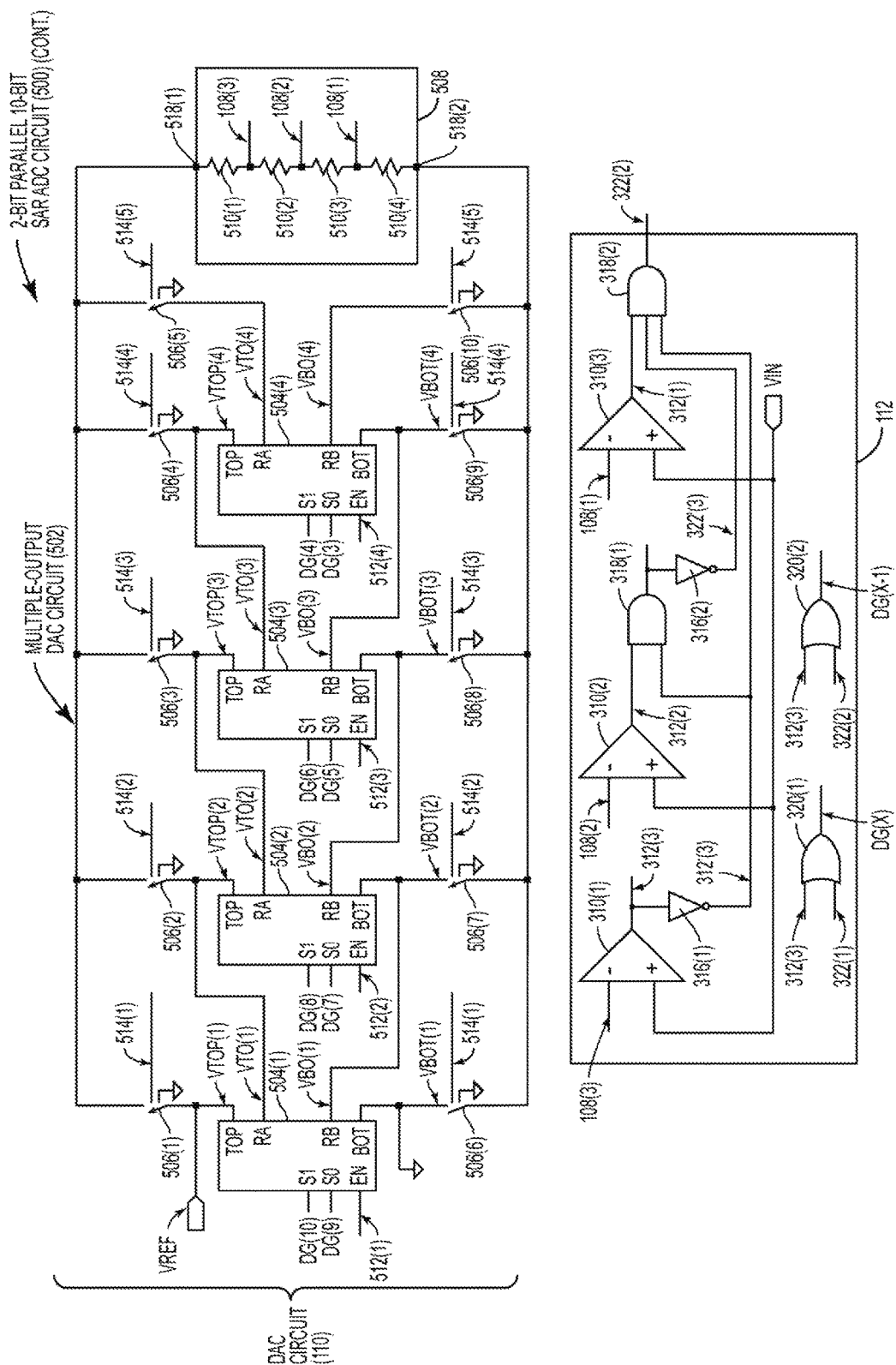

As noted above, the DAC circuit 110 in the multiple-bit parallel SAR ADC circuit 100 of FIG. 1 can employ one multiple-output DAC circuit to reduce overall area consumption. In this regard, FIGS. 5A and 5B illustrate an exemplary multiple-bit parallel SAR ADC circuit 500, wherein the DAC circuit 110 includes a multiple-output DAC circuit 502. The multiple-bit parallel SAR ADC circuit 500 may also be referred to as a two (2)-bit parallel ten (10)-bit SAR ADC circuit 500. The multiple-bit parallel SAR ADC circuit 500 includes common elements with the multiple-bit parallel SAR ADC circuits 100, 300 of FIGS. 1 and 3A-3B, respectively, which are referred to with common element numbers in FIGS. 1, 3A-3B, and 5A-5B, and thus will not re-described herein.

With continuing reference to FIG. 5B, the multiple-output DAC circuit 502 includes DAC stages 504(1)-504(4), switches 506(1)-506(10), and a divider circuit 508 that employs resistors 510(1)-510(4). Additionally, in this aspect, the SAR controller circuit 102(2) is configured to provide enable signals 512(1)-512(5) and DAC select signals 514(1)-514(5) corresponding to each SAR register circuit 104(2)(1)-104(2)(5). The LCK signal in the SAR register circuit 400 in FIG. 4 is derived from the output Q of the NAND latch 410, which is coupled to the enable signals 512(1)-512(5). In particular, the enable signals 512(1)-512(5) are generated by the SAR register circuits 104(2)(1)-104(2)(5), wherein each enable signal 512(1)-512(5). The OR gate 516 in FIG. 5A logically OR's the enable signal 512(5) into the DAC select signal 514(5) that controls switches 506(5), 506(10) in FIG. 5B parlance) to provide for impedance/resistance between the terminal of voltage VREF and ground inputs to the multiple-output DAC circuit 502 remains substantially constant regardless of the state of control signals. When the enable signal 512(1)-514(4) to a given DAC stage 504(1)-504(4) is logic '0' value, then that DAC stage 504(1)-504(4) presents an open circuit between its VTOP(1)-VTOP(4) and VBOT(1)-VBOT(4) terminals. The DAC select signals 514(1)-514(4) correspond to values provided to each select input node SEL of each corresponding SAR register circuit 104(2)(1)-104(2)(4), while the DAC select signal 514(5) is provided as an output of an OR gate 516 that receives the enable signal 512(5) and a select signal SEL provided to the SAR register circuit 104(2)(5).

With continuing reference to FIGS. 5A and 5B, each DAC stage 504(1)-504(4) is configured to receive a corresponding top voltage VTOP(1)-VTOP(4), a corresponding bottom voltage VBOT(1)-VBOT(4), and corresponding digital bits DG(1)-DG(10). The loading of later stages determines what voltages will appear at each of the top voltages VTOP(1)-VTOP(4) and corresponding bottom voltages VBOT(1)-VBOT(4). Each DAC stage 504(1)-504(4) is further configured to generate corresponding top output voltages VTO(1)-VTO(4) and bottom output voltages VBO(1)-VBO(4) by dividing a voltage range of each corresponding top voltage VTOP(1)-VTOP(4) and each bottom voltage VBOT(1)-VBOT(4) based on the values of the digital bits DG(1)-DG(10). For example, the DAC stage 504(1) is configured to receive the reference voltage VREF as the top voltage VTOP(1), a ground signal as the bottom voltage VBOT(1), and the digital bits DG(10), DG(9). The top output voltage VTO(1) and the bottom output voltage VBO(1) of the DAC stage 504(1) are generated by dividing the voltage range between the reference voltage VREF and the ground signal based on the value of the digital bits DG(10), DG(9).

With continuing reference to FIGS. 5A and 5B, the top and bottom output voltages VTO(1), VBO(1) are provided to the DAC stage 504(2) as the top and bottom voltages VTOP(2), VBOT(2), respectively. The DAC stage 504(2) is also configured to receive the digital bits DG(8), DG(7). Thus, the top output voltage VTO(2) and the bottom output voltage VBO(2) of the DAC stage 504(2) are generated by dividing the voltage range between the top and bottom output voltages VTO(1), VBO(1) based on the value of the digital bits DG(8), DG(7). Additionally, the top and bottom output voltages VTO(2), VBO(2) are provided to the DAC stage 504(3) as the top and bottom voltages VTOP(3), VBOT(3), respectively. The DAC stage 504(3) is also configured to receive the digital bits DG(6), DG(5). Thus, the top output voltage VTO(3) and the bottom output voltage VBO(3) of the DAC stage 504(3) are generated by dividing the voltage range between the top and bottom output voltages VTO(2), VBO(2) based on the value of the digital bits DG(6), DG(5). Further, the top and bottom output voltages VTO(3), VBO(3) are provided to the DAC stage 504(4) as the top and bottom voltages VTOP(4), VBOT(4), respectively. The DAC stage 504(4) is also configured to receive the digital bits DG(4), DG(3). Thus, the top output voltage VTO(4) and the bottom output voltage VBO(4) of the DAC stage 504(4) are generated by dividing the voltage range between the top and bottom output voltages VTO(3), VBO(3) based on the value of the digital bits DG(4), DG(3).

With continuing reference to FIGS. 5A and 5B, the DAC select signals 514(1)-514(5) are provided to the switches 506(1)-506(5) and 506(6)-506(10), respectively. Based on the values of the DAC select signals 514(1)-514(5), some combination of the reference voltage VREF and the top output voltage VTO(1)-VTO(4) are provided to an input node 518(1) of the divider circuit 508. Additionally, based on the values of the DAC select signals 514(1)-514(5) activating some combination of the switches 506(6)-506(10), some combination of the ground signal and the bottom output voltage VBO(1)-VBO(4) are provided to an input node 518(2) of the divider circuit 508. In this aspect, the resistors 510(1)-510(4) each have an approximately equal resistance (e.g., two (2) kilo-Ohms (kΩ)) such that the divider circuit 508 generates the DAC analog signals 108(1)-108(3) as approximately equal divisions of the voltages provided to the divider circuit 508 (e.g., divisions of the corresponding voltage range). The voltage divider 508 can be connected either directly between the terminals of the voltage VTOP(1) and VBOT(1) or between any pair of terminals of the voltages VTOP(1)-VTOP(4) and VBOT(1)-VBOT(4).

The DAC analog signals 108(1)-108(3) are used by the compare circuit 112 to generate the digital output signal DOUT having the digital bits DG(1)-DG(10) in five (5) cycles of the clock signal CLK similar to the example described with reference to FIGS. 3A and 3B. Common element numbers are used between the compare circuit 112 in FIG. 5B and the compare circuit in FIG. 3B for common elements, which will not be re-described.

Figure 6:
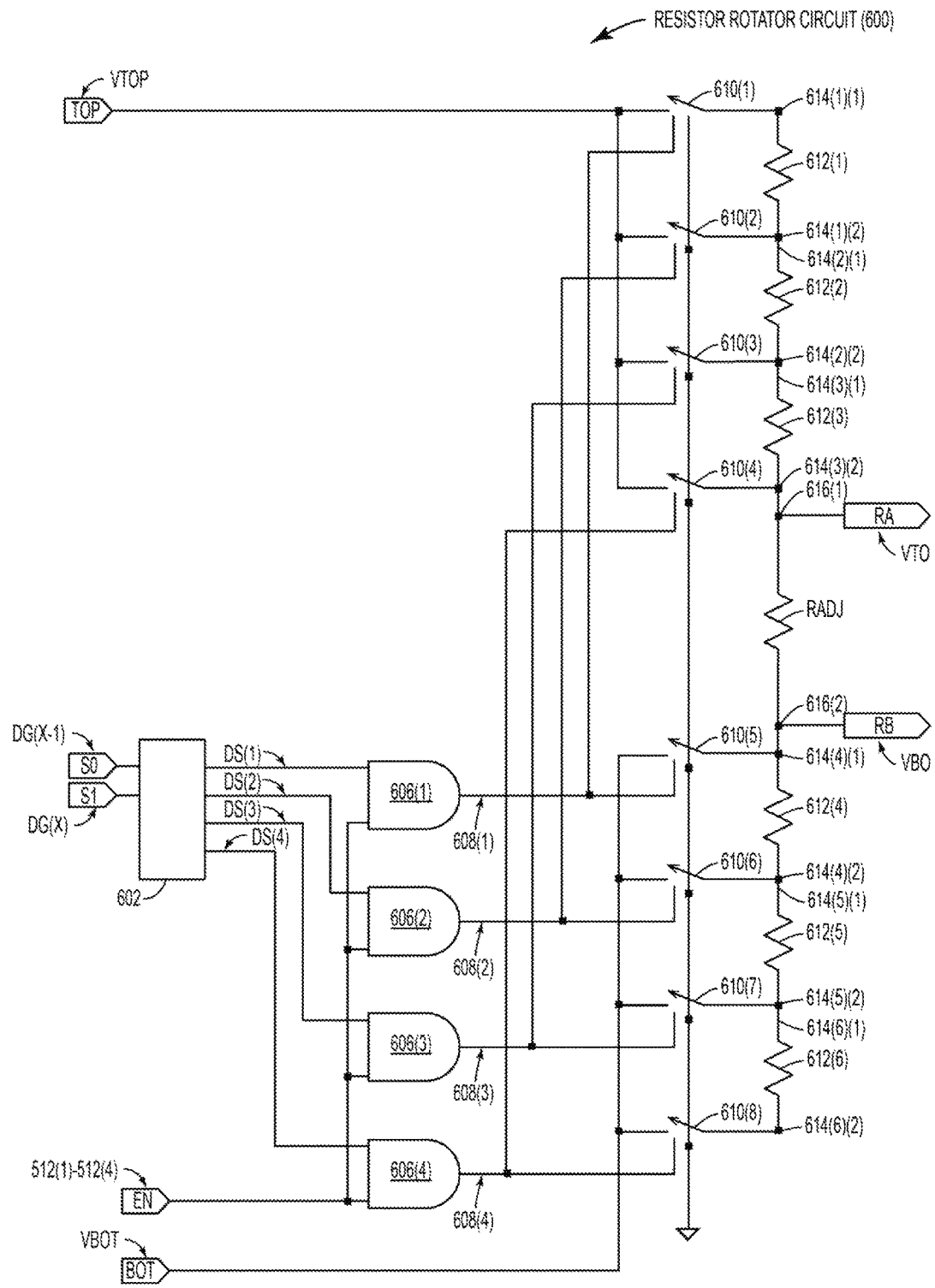
FIG. 6 is a circuit diagram of an exemplary resistor rotator circuit that can be employed for each stage of the multiple-output DAC circuit of FIG. 5B.

As discussed below beginning in FIGS. 7A and 7B, other aspects may include a successive approximation (SA) Flash-based compare circuit instead of the compare circuit 112 described herein. Employing the multiple-output DAC circuit 502 allows the multiple-bit parallel SAR ADC circuit 500 to generate the digital output signal DOUT in five (5) cycles of the clock signal CLK, rather than in ten (10) cycles as needed by conventional single-bit SAR ADC circuits, while consuming less area than the multiple-bit parallel SAR ADC circuit 300. FIG. 6 illustrates an exemplary resistor rotator circuit 600 that can be employed in each DAC stage 504(1)-504(4) of FIGS. 5A-5B. The resistor rotator circuit 600 is configured to receive a top voltage VTOP on a top voltage input node TOP, and a bottom voltage VBOT on a bottom voltage input node BOT. The resistor rotator circuit 600 also includes a decoder circuit 602 configured to receive the digital bits DG(X), DG(X-1) on input nodes SI, S0 corresponding to the DAC stage 504(1)-504(4) described in FIGS. 5A-5B, and generate decode signals DS(1)-DS(4) based on the digital bits DG(X), DG(X-1). In this aspect, the decoder circuit 602 is a one-hot decoder, wherein only one of the decode signals DS(1)-DS(4) has a logic high "1" value. For example, the decode signals DS(1)-DS(4) are generated according to the following logic functions: DS(1)=(inverse DG(X) AND inverse DG(X-1)); DS(2)=(inverse DG(X) AND DG(X-1)); DS(3)=(DG(X) AND inverse DG(X-1)); and DS(4)=DG(X) AND DG(X-1)). Each decode signal DS(1)-DS(4) is provided to a corresponding AND gate 606(1)-606(4). Each AND gate 606(1)-606(4) also receives one of the enable signal 512(1)-512(4) corresponding to the DAC stage 504(1)-504(4) described in FIGS. 5A-5B via an enable input node EN, and generates a corresponding resistor select signal 608(1)-608(4).

With continuing reference to FIG. 6, the resistor rotator circuit 600 also includes switches 610(1)-610(8), wherein a logic high "1" value closes a switch 610(1)-610(8), and a logic low "0" value opens a switch 610(1)-610(8). The switches 610(1)-610(8) are used in conjunction with resistors 612(1)-612(6) to generate the top and bottom output voltages VTO(1)-VTO(4), VBO(1)-VBO (4) on respective voltage output nodes RA, RB for the corresponding DAC stage 504(1)-504(4). The voltage divider 508 in FIG. 5 being connected across any terminals for VTOP(1)-VTOP(4), VBOT(1)-VBOT(4), the RADJ in parallel with the total resistance of the voltage divider 508 creates an effective resistance equal to each of the resistors 612(1)-612(6) to present an ideal resistance to the terminals for VTOP(1)-VTOP(4), VBOT(1)-VBOT(4). In particular, the resistor 612(1) includes a first node 614(1)(1) electrically coupled to the switch 610(1), and a second node 614(1)(2) electrically coupled to the switch 610(2). The resistor 612(2) includes a first node 614(2)(1) electrically coupled to the switch 610(2), and a second node 614(2)(2) electrically coupled to the switch 610(3). The resistor 612(3) includes a first node 614(3)(1) electrically coupled to the switch 610(3), and a second node 614(3)(2) electrically coupled to the switch 610(4). Further, the resistor 612(4) includes a first node 614(4)(1) electrically coupled to the switch 610(5), and a second node 614(4)(2) electrically coupled to the switch 610(6). The resistor 612(5) includes a first node 614(5)(1) electrically coupled to the switch 610(6), and a second node 614(5)(2) electrically coupled to the switch 610(7). The resistor 612(6) includes a first node 614(6)(1) electrically coupled to the switch 610(7), and a second node 614(6)(2) electrically coupled to the switch 610(8).

With continuing reference to FIG. 6, the switches 610(1), 610(5) are configured to receive the resistor select signal 608(1), and the switches 610(2), 610(6) are configured to receive the resistor select signal 608(2). Further, the switches 610(3), 610(7) are configured to receive the resistor select signal 608(3), and the switches 610(4), 610(8) are configured to receive the resistor select signal 608(4). A resistor RADJ is also included, wherein a first node 616(1) is electrically coupled to the top voltage output node RA, and a second node 616(2) is electrically coupled to the bottom voltage output node RB. A resistance of the resistor RADJ is adjusted such that the parallel combination of the resistor RADJ and a desired resistance R_NEXT of a next DAC stage 504 is maintained at a desired constant value equal to the other resistors 612(1)-612(6) so that the resistor rotator circuit 600 generates the desired output. In this manner, the configuration above results in the resistor rotator circuit 600 generating the corresponding top and bottom output voltages VTO(1)-VTO(4), VBO(1)-VBO(4) according to which of the switches 610(1)-610(8) are open or closed based on the digital bits DG(X), DG(X-1).

As noted above, aspects of the multiple-bit parallel SAR ADC circuit 100 of FIG. 1 may include the compare circuit 112 that employs SA Flash-based compare circuits, thus eliminating the need for the TTB circuit 314 in FIGS. 3A-3B. In this regard, FIGS. 7A and 7B illustrate an exemplary three (3) bit parallel twelve (12) bit SAR ADC circuit 700 that employs a multiple-output DAC circuit 702 and a SA Flash-based compare circuit 704. Although not illustrated herein, other aspects employing the SA Flash-based compare circuit 704 may employ a DAC circuit that includes single-output DACs instead of the multiple-output DAC circuit 702 described herein. The three (3) bit parallel twelve (12) bit SAR ADC circuit 700 includes common elements with the multiple-bit parallel SAR ADC circuits 100, 300, and 500 of FIGS. 1, 3A-3B, and 5A-5B, respectively, which are referred to with common element numbers in FIGS. 1, 3A-3B, 5A-5B, and 7A-7B, and thus will not re-described herein.

Figure 7A:
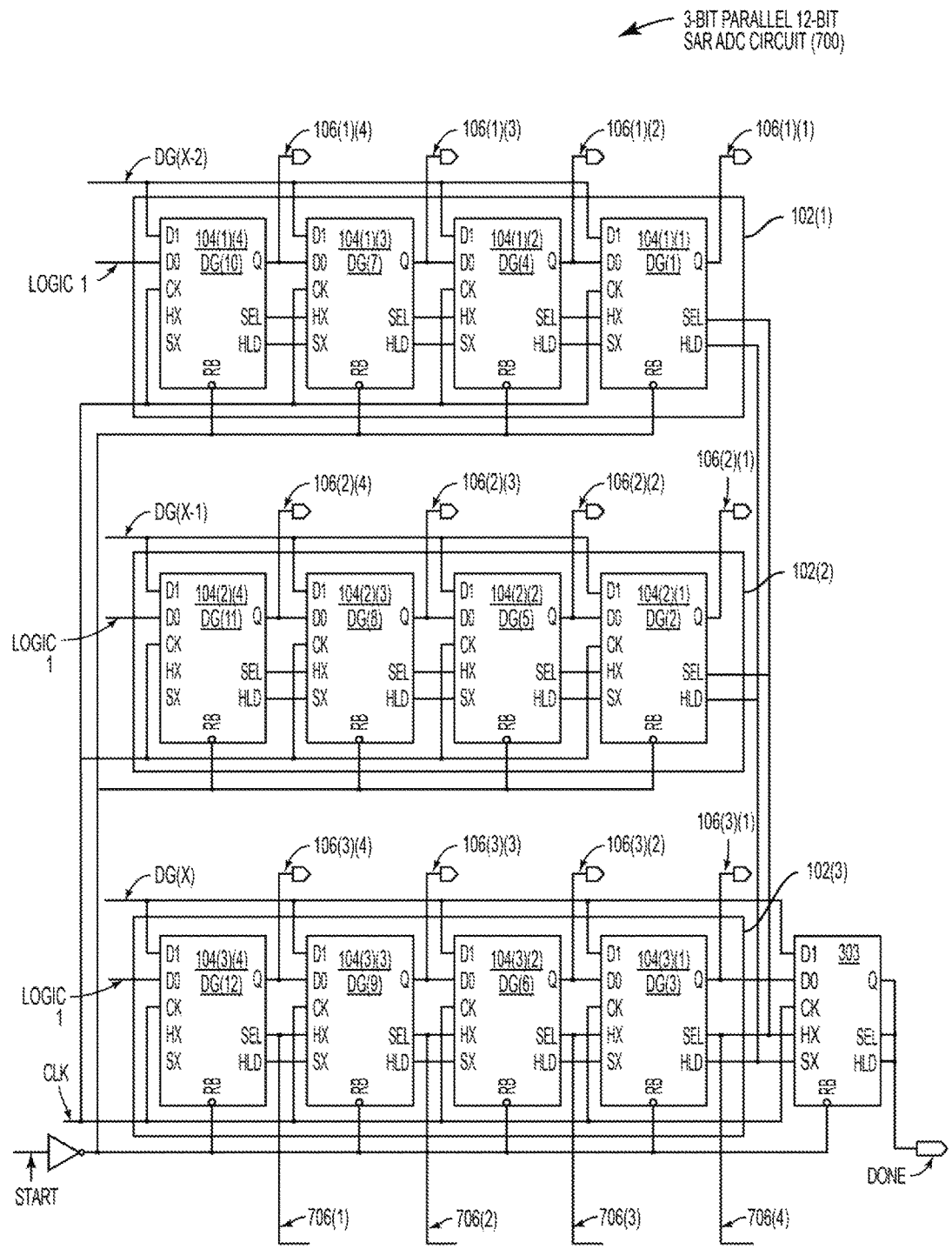
FIGS. 7A and 7B illustrate a circuit diagram of an exemplary multiple-bit parallel SAR ADC circuit that employs a multiple-output DAC circuit and a successive approximately (SA) Flash-based compare circuit.
Figure 7B:
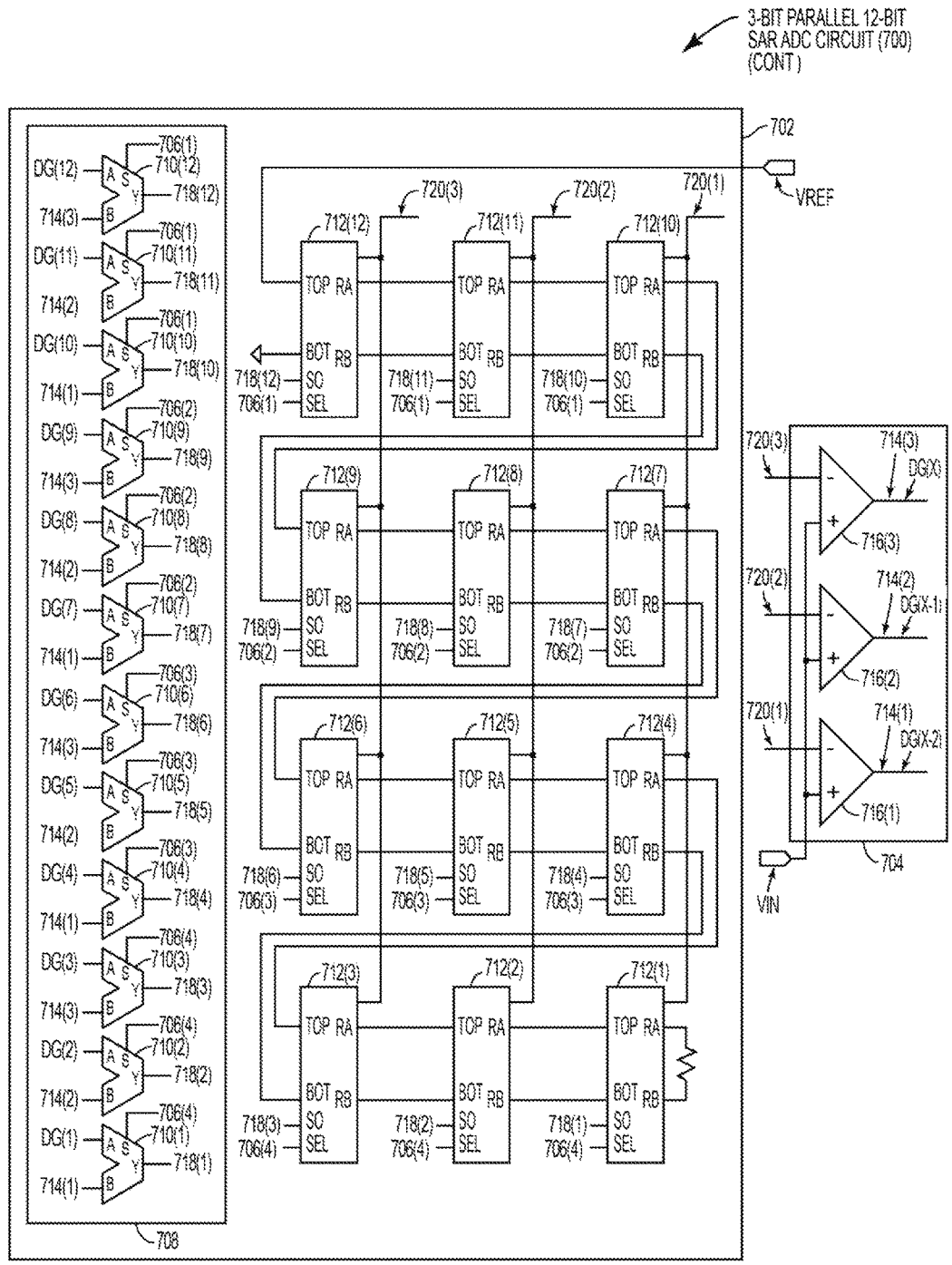

With continuing reference to FIGS. 7A and 7B, the three (3) bit parallel twelve (12) bit SAR ADC circuit 700 includes SAR controller circuits 102(1)-102(3), each of which includes four (4) SAR register circuits 104(1)(1)-104(3)(4).

In this manner, the SAR register circuits 104(1)(1)-104(1)(4) correspond to digital bits DG(1), DG(4), DG(7), and DG(10), the SAR register circuits 104(2)(1)-104(2)(4) correspond to digital bits DG(2), DG(5), DG(8), and DG(11), and the SAR register circuits 104(3)(1)-104(3)(4) correspond to digital bits DG(3), DG(6), DG(9), and DG(12). Additionally, DAC select signals 706(1)-706(4) correspond to values provided to each select input node SEL of each corresponding SAR register circuit 104(3)(1)-104(3)(4).

With continuing reference to FIGS. 7A and 7B, the multiple-output DAC circuit 702 includes a selection circuit 708 employing multiplexer circuits 710(1)-710(12). The multiple-output DAC circuit 702 also includes DAC stages 712(1)-712(12). In this manner, a number of the multiplexer circuits 710(1)-710(12) and a number of the DAC stages 712(1)-712(12) is equal to the number of digital bits DG(1)-DG(12) in the digital output signal DOUT. Further, each multiplexer circuit 710(1)-710(12) is configured to receive the corresponding digital bit DG(1)-DG(12). The multiplexer circuits 710(1), 710(4), 710(7), and 710(10) are configured to also receive a comparator signal 714(1) from a compare circuit 716(1), and the multiplexer circuits 710(2), 710(5), 710(8), and 710(11) are configured to also receive a comparator signal 714(2) from a compare circuit 716(2). The multiplexer circuits 710(3), 710(6), 710(9), and 710(12) are configured to also receive a comparator signal 714(3) from a compare circuit 716(3). The multiplexer circuits 710(1)-710(3) are configured to receive the DAC select signal 706(4), and the multiplexer circuits 710(4)-710(6) are configured to receive the DAC select signal 706(3). The multiplexer circuits 710(7)-710(9) are configured to receive the DAC select signal 706(2), and the multiplexer circuits 710(10)-710(12) are configured to receive the DAC select signal 706(1). The DAC select signals 706(1)-706(4) select between the input values of the respective multiplexer circuit 710(1)-710(12) such that the multiplexer circuits 710(1)-710(12) provide a corresponding resistor select signal 718(1)-718(12).

With continuing reference to FIGS. 7A and 7B, and specific reference to FIG. 7B, the DAC stages 712(1)-712(12) are configured to receive the corresponding resistor select signals 718(1)-718(12) on a respective input node S0. Further, the DAC stages 712(1)-712(3) are configured to receive the DAC select signal 706(4), and the DAC stages 712(4)-712(6) are configured to receive the DAC select signal 706(3) on a respective select input node SEL. The DAC stages 712(7)-712(9) are configured to receive the DAC select signal 706(2), and the DAC stages 712(10)-712(12) are configured to receive the DAC select signal 706(1) on a respective select input node SEL. As discussed in more detail with reference to FIG. 8, each DAC stage 712(1)-712(12) is configured to receive top and bottom voltages VTOP, VBOT on respective top and bottom input nodes TOP, BOT, and provided respective output voltage VTO, VBO on respective voltage output nodes RA, RB. As a result, the DAC stages 712(1), 712(4), 712(7), and 712(10) provide a DAC analog signal 720(1), the DAC stages 712(2), 712(5), 712(8), and 712(11) provide a DAC analog signal 720(2), and the DAC stages 712(3), 712(6), 712(9), and 712(12) provide a DAC analog signal 720(3). Further, the DAC analog signals 720(1)-720(3) are provided to corresponding compare circuits 716(1)-716(3), wherein the compare circuits 716(1)-716(3) also receive the analog input signal VIN. It is important to note that the SA Flash-based compare circuit 704 includes a number of the compare circuits 716(1)-716(3) equal to the number of SAR controller circuits 102(1)-102(3).

With continuing reference to FIGS. 7A and 7B, each compare circuit 716(1)-716(3) is configured to generate the corresponding comparator signal 714(1)-714(3), wherein each comparator signal 714(1)-714(3) is a corresponding digital bit DG(1)-DG(12) for the corresponding cycle of the clock signal CLK. In particular, each comparator signal 714(1)-714(3) has a logic high "1" value if the analog input signal VIN has a greater voltage than the corresponding DAC analog signal 720(1)-720(3). Alternatively, each comparator signal 714(1)-714(3) has a logic low "0" value if the analog input signal VIN has a smaller voltage than the corresponding DAC analog signal 720(1)-720(3). Employing the multiple-output DAC circuit 702 and the Flash-based compare circuit 704 as described above allows the three (3) bit parallel twelve (12) bit SAR ADC circuit 700 to generate the digital output signal DOUT in four (4) cycles of the clock signal CLK instead of in twelve (12) cycles of a conventional SAR ADC circuit, while also reducing area consumption in both the DAC and compare circuitry. For example, a 3-bit parallel 12-bit SAR modeled after the two (2) bit parallel ten (10) bit SAR ADC circuit 300 in FIGS. 3A and 3BB, even if it used a multi-output DAC rather than individual single output DACs, would require $2^3-1=7$ comparators, whereas the three (3) bit parallel twelve (12) bit SAR ADC circuit 700 in FIGS. 7A and B requires only three (3) compare circuits 716(1)-716(3) to produce 3 bits per clock period.

Figure 8:
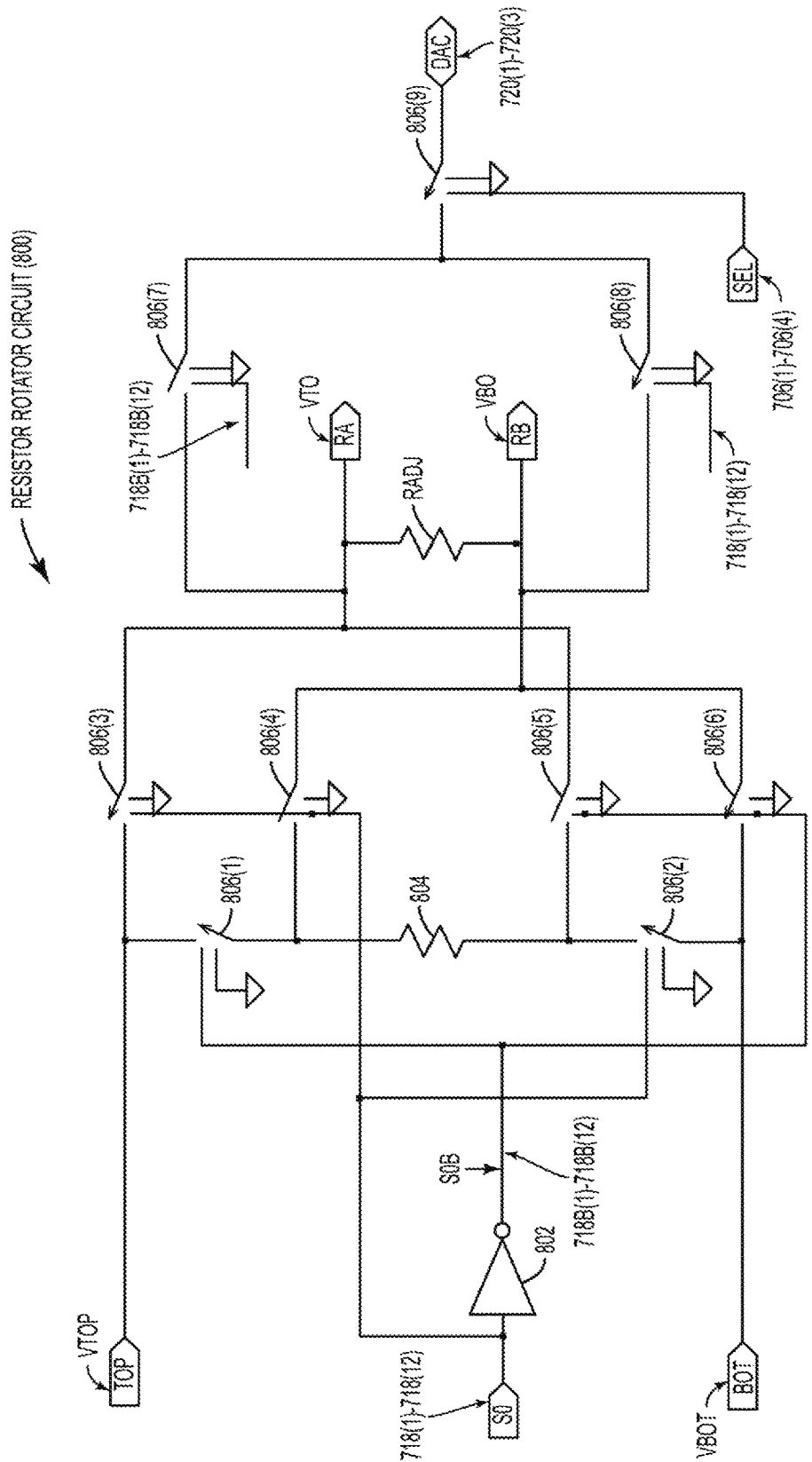
FIG. 8 is a circuit diagram of an exemplary resistor rotator circuit that can be employed for each DAC stage of the multiple-output DAC circuit of FIGS. 7A and 7B.

FIG. 8 illustrates an exemplary resistor rotator circuit 800 that can be employed for each DAC stage 712(1)-712(12) of the multiple-output DAC circuit 702 of FIGS. 7A-7B. In this aspect, the resistor rotator circuit 800 is configured to receive a top voltage VTOP on a top voltage input node TOP, and a bottom voltage VBOT on a bottom voltage input node BOT. Additionally, the resistor rotator circuit 800 is configured to receive the corresponding resistor select signal 718(1)-718(12) on an input node S0, and the corresponding DAC select signal 706(1)-706(4) on a select input node SEL. In this manner, using an inverter 802, a resistor 804, switches 806(1)-806(9), and a resistor RADJ as illustrated in FIG. 8, the corresponding DAC select signal 706(1)-706(4) and resistor select signal 718(1)-718(12) cause the resistor rotator circuit 800 to provide the corresponding top and bottom voltages VTOP, VBOT on the output nodes RA, RB, respectively. The inverter 802 is configured to receive resistor select signals 718(1)-718(12) on a respective input node S0 and invert these signals into complement resistor select signals 718B(1)-718B(12). Additionally, the corresponding DAC analog signal 720(1)-720(3) as illustrated in FIGS. 7A and 7B are provided via an output node DAC. The resistance RADJ in parallel with the equivalent resistance connected between the terminals of the VTO and BTO voltages creates an effective resistance equal to the resistor 804.

The elements described herein are sometimes referred to as means for performing particular functions. In this regard, the SAR controller circuits 102(1)-102(M) are also referred to herein as "a plurality of means for successively approximating a digital value." The SAR register circuits 104(1)(1)-104(M)(P) are also referred to herein as "a number of means for storing the digital value." The DAC circuit 110 is also referred to herein as "a means for converting a digital value into an analog value." The compare circuit 112 is sometimes referred to herein as "a means for comparing." The single-output DAC circuits 302(1)-302(3) are sometimes referred to herein as "a number of single-output means for converting the digital value into an analog value." The TTB circuit 314 is sometimes referred to herein as "a means for converting to binary." The multiple-output DAC circuits 502, 702 are sometimes referred to herein as "a multiple-output means for converting the digital signal to an analog signal." The resistor rotator circuits 600, 800 are sometimes referred to herein as "a plurality of means for dividing a voltage."

The multiple-bit parallel SAR ADC circuits according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
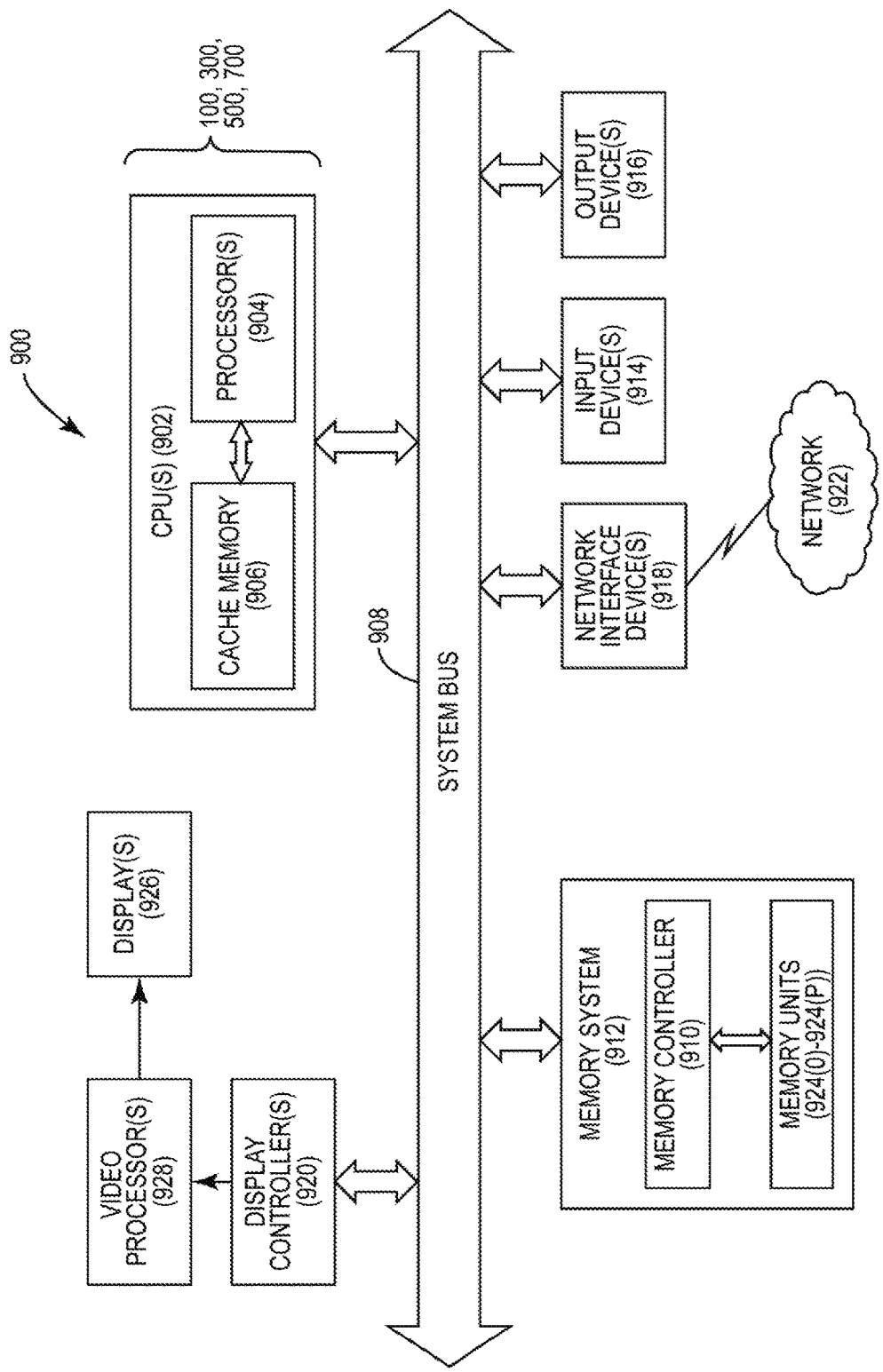
FIG. 9 is a block diagram of an exemplary processor-based system that can include the multiple-bit parallel SAR ADC circuits of FIGS. 1, 3A-3B, 5A-5B, and 7A-7B.

In this regard, FIG. 9 illustrates an example of a processor-based system 900 that can include elements employing the multiple-bit parallel SAR ADC circuits 100, 300, 500, and 700 of FIGS. 1, 3A-3B, 5A-5B, and 7A-7B, respectively. In this example, the processor-based system 900 includes one or more central processing units (CPUs) 902, each including one or more processors 904. The CPU(s) 902 may have cache memory 906 coupled to the processor(s) 904 for rapid access to temporarily stored data. The CPU(s) 902 is coupled to a system bus 908 and can intercouple master and slave devices included in the processor-based system 900. As is well known, the CPU(s) 902 communicates with these other devices by exchanging address, control, and data information over the system bus 908. For example, the CPU(s) 902 can communicate bus transaction requests to a memory controller 910 as an example of a slave device. Although not illustrated in FIG. 9, multiple system buses 908 could be provided, wherein each system bus 908 constitutes a different fabric.

Other master and slave devices can be connected to the system bus 908. As illustrated in FIG. 9, these devices can include a memory system 912, one or more input devices 914, one or more output devices 916, one or more network interface devices 918, and one or more display controllers 920, as examples. The input device(s) 914 can include any type of input device, including, but not limited to, input keys, switches, voice processors, etc. The output device(s) 916 can include any type of output device, including, but not limited to, audio, video, other visual indicators, etc. The network interface device(s) 918 can be any device configured to allow exchange of data to and from a network 922. The network 922 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 918 can be configured to support any type of communications protocol desired. The memory system 912 can include one or more memory units 924(0)-924(P).

The CPU(s) 902 may also be configured to access the display controller(s) 920 over the system bus 908 to control information sent to one or more displays 926. The display controller(s) 920 sends information to the display(s) 926 to be displayed via one or more video processors 928, which process the information to be displayed into a format suitable for the display(s) 926. The display(s) 926 can include any type of display, including, but not limited to, a cathode ray tube (CRT), a liquid crystal display (LCD), a plasma display, a light emitting diode (LED) display, etc.

Figure 10:
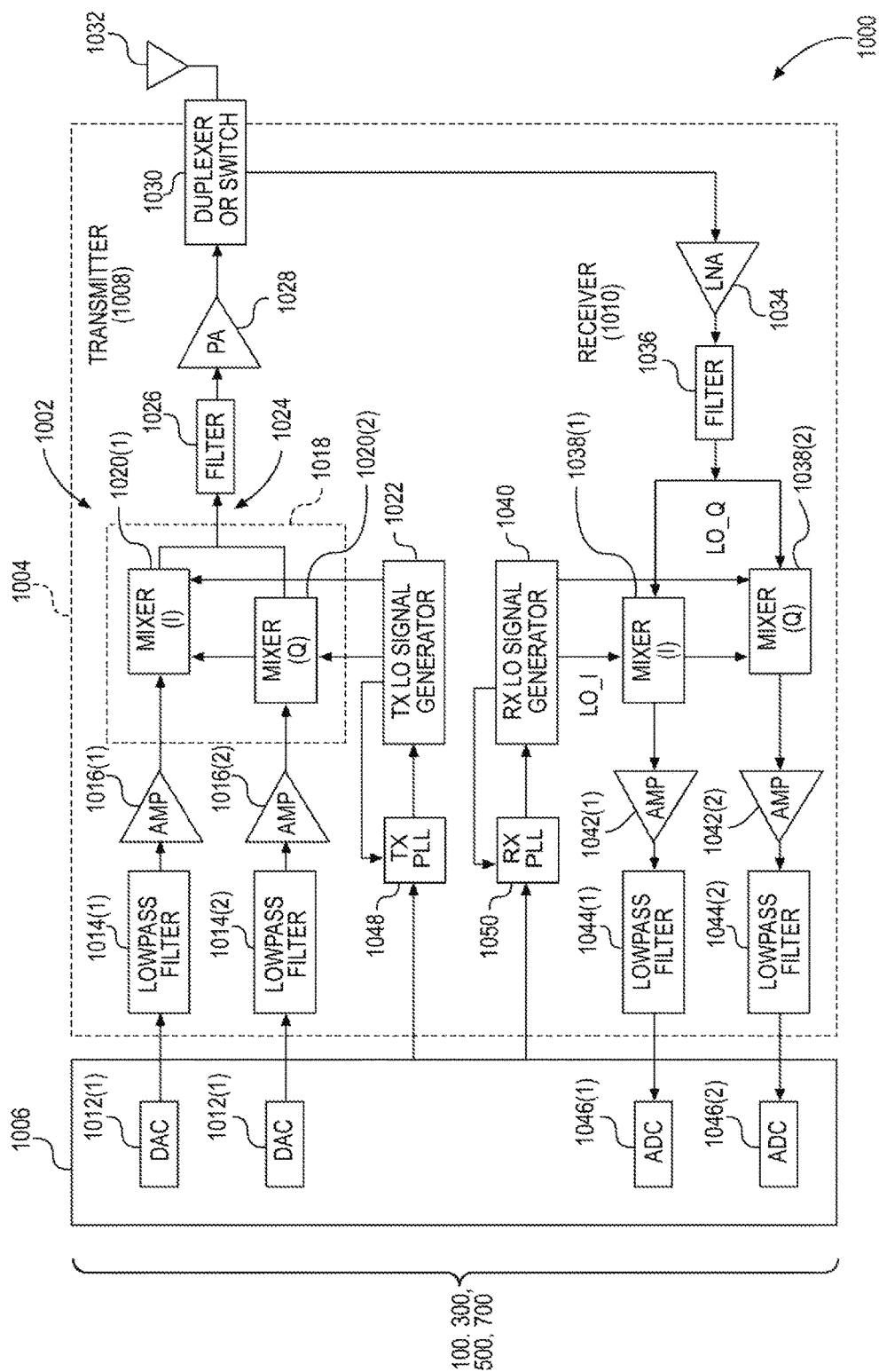
FIG. 10 is a block diagram of an exemplary wireless communications device that includes radio frequency (RF) components formed in an integrated circuit (IC), wherein the RF components can include elements employing the multiple-bit parallel SAR ADC circuits of FIGS. 1, 3A-3B, 5A-5B, and 7A-7B.

FIG. 10 illustrates an exemplary wireless communications device 1000 that includes radio frequency (RF) components formed in an integrated circuit (IC) 1002, wherein the RF components can include elements employing the multiple-bit parallel SAR ADC circuits 100, 300, 500, and 700 of FIGS. 1, 3A-3B, 5A-5B, and 7A-7B, respectively. In this regard, the wireless communications device 1000 may be provided in the IC 1002. The wireless communications device 1000 may include or be provided in any of the above referenced devices, as examples. As shown in FIG. 10, the wireless communications device 1000 includes a transceiver 1004 and a data processor 1006. The data processor 1006 may include a memory to store data and program codes. The transceiver 1004 includes a transmitter 1008 and a receiver 1010 that support bi-directional communications. In general, the wireless communications device 1000 may include any number of transmitters 1008 and/or receivers 1010 for any number of communication systems and frequency bands. All or a portion of the transceiver 1004 may be implemented on one or more analog ICs, RF ICs (RFICs), mixed-signal ICs, etc.

The transmitter 1008 or the receiver 1010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1010. In the direct-conversion architecture, a signal is frequency-converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides I and Q analog output signals to the transmitter 1008. In the exemplary wireless communications device 1000, the data processor 1006 includes digital-to-analog converters (DACs) 1012(1), 1012(2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired signals caused by the prior digital-to-analog conversion. Amplifiers (AMP) 1016(1), 1016(2) amplify the signals from the lowpass filters 1014(1), 1014(2), respectively, and provide I and Q baseband signals. An upconverter 1018 upconverts the I and Q baseband signals with I and Q transmit (TX) local oscillator (LO) signals through mixers 1020(1), 1020(2) from a TX LO signal generator 1022 to provide an upconverted signal 1024. A filter 1026 filters the upconverted signal 1024 to remove undesired signals caused by the frequency upconversion as well as noise in a receive frequency band. A power amplifier (PA) 1028 amplifies the upconverted signal 1024 from the filter 1026 to obtain the desired output power level and provides a transmit RF signal. The transmit RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific receive (RX)-to-TX duplexer frequency separation, such that RX signals are isolated from TX signals. The received RF signal is amplified by the LNA 1034 and filtered by a filter 1036 to obtain a desired RF input signal. Downconversion mixers 1038(1), 1038(2) mix the output of the filter 1036 with I and Q RX LO signals (i.e., LO_I and LO_Q) from an RX LO signal generator 1040 to generate I and Q baseband signals. The I and Q baseband signals are amplified by amplifiers (AMP) 1042(1), 1042(2) and further filtered by lowpass filters 1044(1), 1044(2) to obtain I and Q analog input signals, which are provided to the data processor 1006. In this example, the data processor 1006 includes ADCs 1046(1), 1046(2) for converting the analog input signals into digital signals to be further processed by the data processor 1006.

In the wireless communications device 1000 of FIG. 10, the TX LO signal generator 1022 generates the I and Q TX LO signals used for frequency upconversion, while the RX LO signal generator 1040 generates the I and Q RX LO signals used for frequency downconversion. Each LO signal is a periodic signal with a particular fundamental frequency. A TX phase-locked loop (PLL) circuit 1048 receives timing information from the data processor 1006 and generates a control signal used to adjust the frequency and/or phase of the TX LO signals from the TX LO signal generator 1022. Similarly, an RX PLL circuit 1050 receives timing information from the data processor 1006 and generates a control signal used to adjust the frequency and/or phase of the RX LO signals from the RX LO signal generator 1040.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A multiple-bit parallel successive approximation register (SAR) analog-to-digital converter (ADC) circuit, comprising:

a plurality of SAR controller circuits, wherein each SAR controller circuit of the plurality of SAR controller circuits comprises a number of SAR register circuits, wherein each SAR register circuit is configured to:

receive a clock signal;

in response to a corresponding cycle of the clock signal, provide a digital signal correlating to a supply voltage; and in response to a corresponding next cycle of the clock signal:

receive a corresponding digital bit, wherein the digital bit is based on a comparison of an analog input signal and a corresponding digital-to-analog converter (DAC) analog signal;
store the digital bit; and
provide the digital signal correlating to the digital bit;
a DAC circuit configured to:
receive a reference voltage;
receive a plurality of digital signals from the plurality of SAR controller circuits, wherein each digital signal corresponds to a digital bit of a digital output signal; and
generate a plurality of DAC analog signals, wherein each DAC analog signal is based on the reference voltage and the plurality of digital signals; and
a compare circuit configured to:
receive the plurality of DAC analog signals;
receive the analog input signal; and
generate the digital bit corresponding to each SAR controller circuit of the plurality of SAR controller circuits based on a comparison of each DAC analog signal to the analog input signal, wherein each digital bit generated collectively forms the digital output signal that is a digital representation of the analog input signal.

2. The multiple-bit parallel SAR ADC circuit of claim 1, wherein:
the DAC circuit comprises:
a trial bit circuit configured to:
receive the digital signal from each SAR register circuit of each SAR controller circuit;
receive a trial signal from each SAR register circuit of a subset of the plurality of SAR controller circuits; and
generate a plurality of trial bit codes based on the digital signals and the trial signals, wherein each trial bit code comprises a digital bit sequence with values for a subset of the digital bits corresponding to the digital output signal; and
a number of single-output DAC circuits, the number of single-output DAC circuits equal to two (2) raised to a number of the plurality of SAR controller circuits, quantity minus one (1), wherein each single-output DAC circuit is configured to:
receive the plurality of trial bit codes; and
generate corresponding DAC analog signals among the plurality of DAC analog signals, wherein each corresponding DAC analog signal is based on the reference voltage and a corresponding trial bit code; and
the compare circuit comprises:
a number of compare circuits, the number of compare circuits equal to two (2) raised to the number of the plurality of SAR controller circuits, quantity minus one (1), wherein each compare circuit is configured to:
receive the analog input signal and the corresponding DAC analog signal; and
generate a comparator signal, wherein:
the comparator signal has a logic high value if the analog input signal has a greater voltage than the corresponding DAC analog signal; and
the comparator signal has a logic low value if the analog input signal has a smaller voltage than the corresponding DAC analog signal; and
a thermometer-to-binary (TTB) circuit, configured to:
receive the comparator signal from each compare circuit; and
generate the digital bit corresponding to each SAR controller circuit based on the comparator signal from each compare circuit.

3. The multiple-bit parallel SAR ADC circuit of claim 1, wherein the DAC circuit comprises a multiple-output DAC circuit configured to:
receive a top voltage and a bottom voltage, wherein a voltage range of the top voltage and the bottom voltage is based on the reference voltage; and
generate the plurality of DAC analog signals based on the top voltage and the bottom voltage.

4. The multiple-bit parallel SAR ADC circuit of claim 3, wherein each DAC analog signal of the plurality of DAC analog signals has a value that is a division of the voltage range.

5. The multiple-bit parallel SAR ADC circuit of claim 3, wherein the multiple-output DAC circuit comprises a plurality of resistor rotator circuits configured to generate the plurality of DAC analog signals by generating multiple divisions of the voltage range.

6. The multiple-bit parallel SAR ADC circuit of claim 3, wherein the compare circuit comprises:
a number of compare circuits, the number of compare circuits equal to two (2) raised to a number of the plurality of SAR controller circuits, quantity minus one (1), wherein each compare circuit is configured to:
receive the analog input signal and the corresponding DAC analog signal; and
generate a comparator signal, wherein:
the comparator signal has a logic high value if the analog input signal has a greater voltage than the corresponding DAC analog signal; and
the comparator signal has a logic low value if the analog input signal has a smaller voltage than the corresponding DAC analog signal; and
a thermometer-to-binary (TTB) circuit, configured to:
receive the comparator signal from each compare circuit; and
generate the digital bit corresponding to each SAR controller circuit based on the comparator signal from each compare circuit.

7. The multiple-bit parallel SAR ADC circuit of claim 3, wherein the compare circuit comprises a number of compare circuits, the number of compare circuits equal to a number of the plurality of SAR controller circuits, wherein each compare circuit is configured to:
receive the analog input signal and the corresponding DAC analog signal; and
generate a comparator signal, wherein:
the comparator signal is the corresponding digital bit;
the comparator signal has a logic high value if the analog input signal has a greater voltage than the corresponding DAC analog signal; and
the comparator signal has a logic low value if the analog input signal has a smaller voltage than the corresponding DAC analog signal.

8. The multiple-bit parallel SAR ADC circuit of claim 1, comprising two (2) SAR controller circuits, wherein each SAR controller circuit comprises five (5) SAR register circuits such that the multiple-bit parallel SAR ADC circuit is configured to generate the digital output signal having ten (10) digital bits.

9. The multiple-bit parallel SAR ADC circuit of claim 1, comprising three (3) SAR controller circuits, wherein each SAR controller circuit comprises four (4) SAR register circuits such that the multiple-bit parallel SAR ADC circuit is configured to generate the digital output signal having twelve (12) digital bits.

10. The multiple-bit parallel SAR ADC circuit of claim 1 integrated into an integrated circuit (IC).

11. The multiple-bit parallel SAR ADC circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. A multiple-bit parallel successive approximation register (SAR) analog-to-digital converter (ADC) circuit, comprising:
a plurality of means for successively approximating a digital value, wherein each means for successively approximating the digital value of the plurality of means for successively approximating the digital value comprises a number of means for storing the digital value, wherein each means for storing the digital value is configured to:
receive a clock signal;
receive a start signal indicating a conversion process;
in response to a corresponding cycle of the clock signal, provide a digital signal correlating to a supply voltage; and
in response to a corresponding next cycle of the clock signal:
receive a corresponding digital bit, wherein the digital bit is based on a comparison of an analog input signal and a corresponding digital-to-analog converter (DAC) analog signal;
store the digital bit; and
provide a digital signal correlating to the digital bit;
a means for converting a digital value into an analog value, configured to:
receive a reference voltage;
receive a plurality of digital signals from a plurality of SAR controllers, wherein each digital signal corresponds to the digital bit of a digital output signal; and
generate a plurality of DAC analog signals, wherein each DAC analog signal is based on the reference voltage and the plurality of digital signals; and
a means for comparing configured to:
receive the plurality of DAC analog signals;
receive the analog input signal; and
generate the digital bit corresponding to each means for successively approximating the digital value of the plurality of means for successively approximating the digital value based on a comparison of each DAC analog signal to the analog input signal, wherein each digital bit generated collectively forms the digital output signal that is a digital representation of the analog input signal.

13. The multiple-bit parallel SAR ADC circuit of claim 12, wherein:

the means for converting the digital value into the analog value comprises:
a means for generating a trial bit code configured to:
receive the digital signal from each means for storing the digital value of each means for successively approximating the digital value; and
generate a plurality of trial bit codes, wherein each trial bit code comprises a digital bit sequence with values for the digital bits corresponding to the digital output signal;
a number of single-output means for converting the digital value into an analog value, the number of single-output means for converting equal to two (2) raised to a number of the plurality of means for successively approximating the digital value, quantity minus one (1), wherein each single-output means for converting is configured to:
receive the plurality of trial bit codes; and
generate corresponding DAC analog signals, wherein each corresponding DAC analog signal is based on the reference voltage and a corresponding trial bit code; and
the means for comparing comprises:
a number of means for performing comparisons, the number of means for performing comparisons equal to two (2) raised to the number of the plurality of means for successively approximating the digital value, quantity minus one (1), wherein each means for performing comparisons is configured to:
receive the analog input signal and the corresponding DAC analog signal; and
generate a comparator signal, wherein:
the comparator signal has a logic high value if the analog input signal has a greater voltage than the corresponding DAC analog signal; and
the comparator signal has a logic low value if the analog input signal has a smaller voltage than the corresponding DAC analog signal; and
a means for converting to binary, configured to:
receive the comparator signal from the number of means for performing comparisons; and
generate the digital bit corresponding to each means for successively approximating the digital value.

14. The multiple-bit parallel SAR ADC circuit of claim 12, wherein the means for converting the digital value into the analog value comprises a multiple-output means for converting the digital signal to an analog signal configured to:
receive a top voltage and a bottom voltage, wherein a voltage range of the top voltage and the bottom voltage is based on the reference voltage; and
generate the plurality of DAC analog signals based on the top voltage and the bottom voltage, wherein a number of DAC analog signals is equal to a number of means for performing comparisons in the means for comparing.

15. The multiple-bit parallel SAR ADC circuit of claim 14, wherein each DAC analog signal of the plurality of DAC analog signals has a value that is a division of the voltage range.

16. The multiple-bit parallel SAR ADC circuit of claim 14, wherein the multiple-output means for converting the digital signal into the analog signal comprises a plurality of means for dividing a voltage, wherein each means for dividing the voltage is configured to generate the corresponding DAC analog signal by generating divisions of the voltage range.

17. The multiple-bit parallel SAR ADC circuit of claim 14, wherein the means for comparing comprises:
   the number of means for performing comparisons, the number of means for performing comparisons equal to two (2) raised to a number of the plurality of means for successively approximating, quantity minus one (1), wherein each means for performing comparisons is configured to:
   receive the analog input signal and the corresponding DAC analog signal; and
   generate the digital signal, wherein:
      the digital signal has a logic high value if the analog input signal has a greater voltage than the corresponding DAC analog signal; and
      the digital signal has a logic low value if the analog input signal has a smaller voltage than the corresponding DAC analog signal; and
   a means for converting to binary, configured to:
      receive the digital signal from the means for performing comparisons; and
      generate the digital bit corresponding to each means for successively approximating.

18. The multiple-bit parallel SAR ADC circuit of claim 14, wherein the means for comparing comprises the number of means for performing comparisons, the number of means for performing comparisons equal to a number of the plurality of means for successively approximating, wherein each means for performing comparisons is configured to:
   receive the analog input signal and the corresponding DAC analog signal; and
   generate the digital signal, wherein:
      the digital signal is the corresponding digital bit;
      the digital signal has a logic high value if the analog input signal has a greater voltage than the corresponding DAC analog signal; and
      the digital signal has a logic low value if the analog input signal has a smaller voltage than the corresponding DAC analog signal.

19. A method for converting an analog input signal into a digital output signal, wherein multiple digital bits of the digital output signal are generated in parallel, comprising:
   receiving a clock signal;
   in response to a corresponding cycle of the clock signal, providing a digital signal;
   in response to a corresponding next cycle of the clock signal, receiving a corresponding digital bit, wherein the digital bit is based on a comparison of an analog input signal and a corresponding digital-to-analog converter (DAC) analog signal;
   in response to the corresponding next cycle of the clock signal, storing the digital bit;
   in response to the corresponding next cycle of the clock signal, providing the digital signal correlating to the digital bit;
   receiving a reference voltage;
   generating a plurality of DAC analog signals, wherein each DAC analog signal is based on the reference voltage and a plurality of digital signals; and
   generating the corresponding digital bit based on a comparison of each corresponding DAC analog signal to the analog input signal, wherein each digital bit generated collectively forms the digital output signal that is a digital representation of the analog input signal.

20. The method of claim 19, further comprising:
   generating a plurality of trial bit codes, wherein each trial bit code comprises a digital bit sequence with values for the digital bit corresponding to the digital output signal;
   generating the corresponding DAC analog signal, wherein each corresponding DAC analog signal is based on the reference voltage and a corresponding trial bit code;
   generating a comparator signal, wherein:
      the comparator signal has a logic high value if the analog input signal has a greater voltage than the corresponding DAC analog signal; and
      the comparator signal has a logic low value if the analog input signal has a smaller voltage than the corresponding DAC analog signal; and
   generating the digital bit corresponding to each SAR controller circuit of a plurality of SAR controller circuits based on the comparator signal from each compare circuit.

21. The method of claim 19, further comprising:
   receiving a top voltage and a bottom voltage, wherein a voltage range of the top voltage and the bottom voltage is based on the reference voltage; and
   generating the plurality of DAC analog signals based on the top voltage and the bottom voltage.

22. The method of claim 21, further comprising generating the corresponding plurality of DAC analog signals by generating divisions of the voltage range.

* * * * *